US012057397B2

(12) United States Patent
Liang et al.

(10) Patent No.: US 12,057,397 B2
(45) Date of Patent: Aug. 6, 2024

(54) CAPPING LAYER FOR LINER-FREE CONDUCTIVE STRUCTURES

(71) Applicant: Taiwan Semiconductor Manufacturing Co., Ltd., Hsinchu (TW)

(72) Inventors: Shuen-Shin Liang, Hsinchu County (TW); Chun-I Tsai, Hsinchu (TW); Chih-Wei Chang, Hsin-Chu (TW); Chun-Hsien Huang, Hsinchu (TW); Hung-Yi Huang, Hsin-Chu (TW); Keng-Chu Lin, Ping-Tung (TW); Ken-Yu Chang, Hsinchu (TW); Sung-Li Wang, Hsinchu County (TW); Chia-Hung Chu, Taipei (TW); Hsu-Kai Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/061,676

(22) Filed: Dec. 5, 2022

(65) Prior Publication Data

US 2023/0095976 A1 Mar. 30, 2023

Related U.S. Application Data

(63) Continuation of application No. 17/141,445, filed on Jan. 5, 2021, now Pat. No. 11,521,929.
(Continued)

(51) Int. Cl.
*H01L 23/532* (2006.01)
*H01L 21/768* (2006.01)
(Continued)

(52) U.S. Cl.
CPC .. *H01L 23/53266* (2013.01); *H01L 21/76802* (2013.01); *H01L 21/7685* (2013.01);
(Continued)

(58) Field of Classification Search
CPC ......... H01L 23/53266; H01L 21/76802; H01L 21/7685; H01L 21/28568; H01L 21/76843;
(Continued)

(56) References Cited

U.S. PATENT DOCUMENTS 5,897,369 A * 4/1999 Jun .................. H01L 21/76831
257/E21.585
6,110,826 A * 8/2000 Lou .................. H01L 21/76876
257/769
(Continued)

FOREIGN PATENT DOCUMENTS

CN 106409814 A 2/2017
CN 107302052 A 10/2017
(Continued)

OTHER PUBLICATIONS

Office Action issued in Chinese Patent Application 202110255869 mailed Mar. 29, 2024, 13 pages.

*Primary Examiner* — Karen Kusumakar
(74) *Attorney, Agent, or Firm* — Sterne, Kessler, Goldstein & Fox P.L.L.C.

(57) ABSTRACT

The present disclosure describes a method for forming capping layers configured to prevent the migration of out-diffused cobalt atoms into upper metallization layers In some embodiments, the method includes depositing a cobalt diffusion barrier layer on a liner-free conductive structure that includes ruthenium, where depositing the cobalt diffusion barrier layer includes forming the cobalt diffusion barrier layer self-aligned to the liner-free conductive struc-
(Continued)

ture. The method also includes depositing, on the cobalt diffusion barrier layer, a stack with an etch stop layer and dielectric layer, and forming an opening in the stack to expose the cobalt diffusion barrier layer. Finally, the method includes forming a conductive structure on the cobalt diffusion barrier layer.

20 Claims, 17 Drawing Sheets

Related U.S. Application Data

(60) Provisional application No. 63/016,836, filed on Apr. 28, 2020.

(51) Int. Cl.
*H01L 21/285* (2006.01)
*H01L 23/522* (2006.01)

(52) U.S. Cl.
CPC .. *H01L 21/28568* (2013.01); *H01L 21/76843* (2013.01); *H01L 23/5226* (2013.01)

(58) Field of Classification Search
CPC ........... H01L 23/5226; H01L 21/76883; H01L 23/485; H01L 23/5283; H01L 21/76805; H01L 21/76834; H01L 23/53238; H01L 23/53252; H01L 23/53209; H01L 21/76849
See application file for complete search history.

(56) References Cited

U.S. PATENT DOCUMENTS

| | | | |
|---|---|---|---|
| 6,734,097 B2 * | 5/2004 | Iggulden | ........... H01L 21/76807 438/626 |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,502,466 B1 | 11/2016 | Chuang | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,109,790 B2 | 10/2018 | Chuang | |
| 11,024,801 B2 | 6/2021 | Wu | |
| 11,101,171 B2 * | 8/2021 | Zhang | ............... H01L 21/76879 |
| 2010/0314765 A1 * | 12/2010 | Liang | .................. H01L 23/5226 257/E23.161 |
| 2016/0064648 A1 | 3/2016 | Tsubata | |
| 2016/0163587 A1 * | 6/2016 | Backes | ............ H01L 23/53238 257/751 |
| 2019/0348511 A1 | 11/2019 | Karpov et al. | |
| 2020/0006424 A1 | 1/2020 | Sato et al. | |
| 2020/0106013 A1 | 4/2020 | Strutt et al. | |

FOREIGN PATENT DOCUMENTS

| | | |
|---|---|---|
| CN | 110649155 A | 1/2020 |
| TW | 202002113 A | 1/2020 |
| TW | 202002343 A | 1/2020 |

* cited by examiner

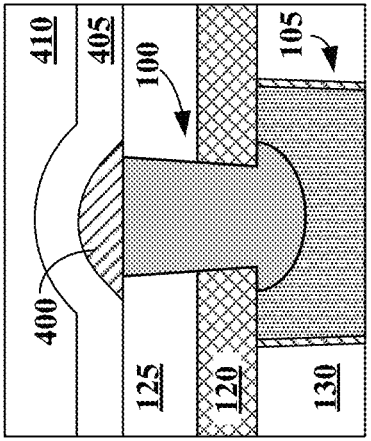
Fig. 4A
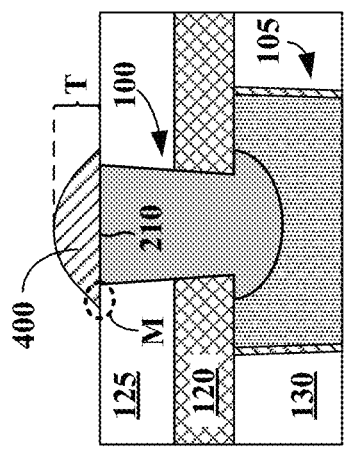
Fig. 4B
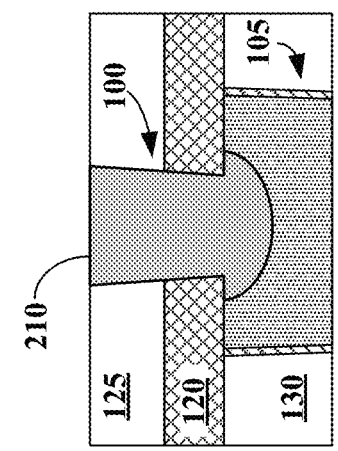
Fig. 4C
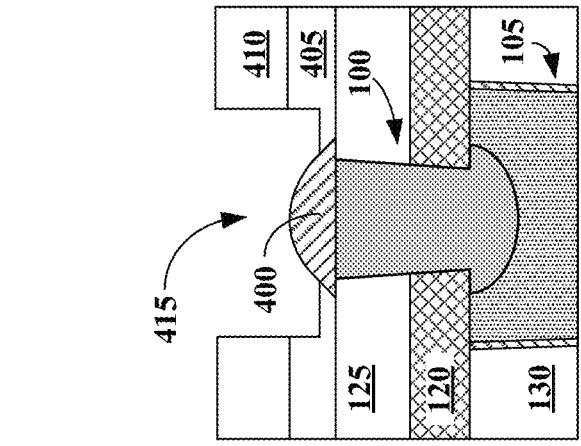
Fig. 4D   Fig. 4D'
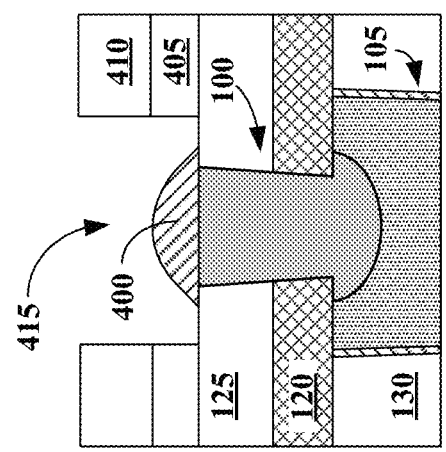

900

905 — Recess a ruthenium conductive structure with respect to a surrounding dielectric layer 910 — Selectively deposit a capping layer on the recessed ruthenium conductive structure 915 — Form an upper metallization conductive structure on the capping layer

Fig. 9

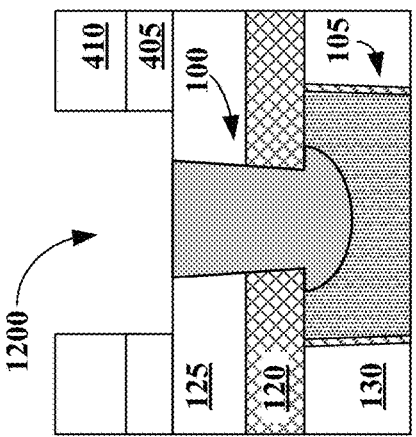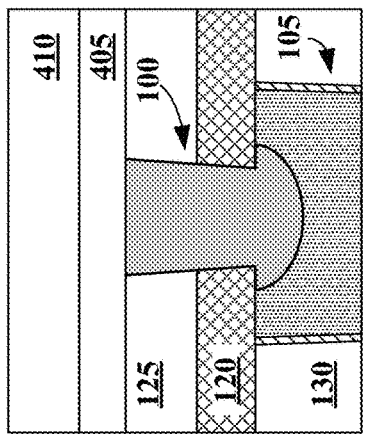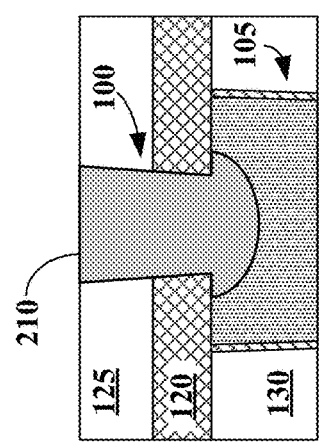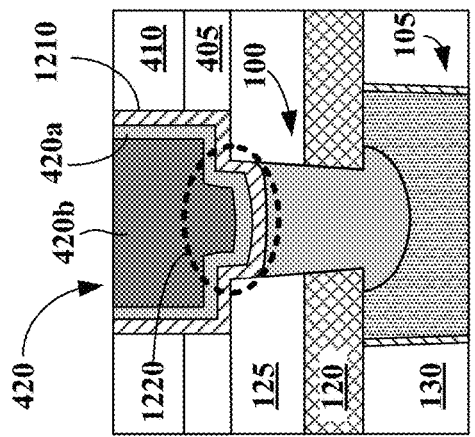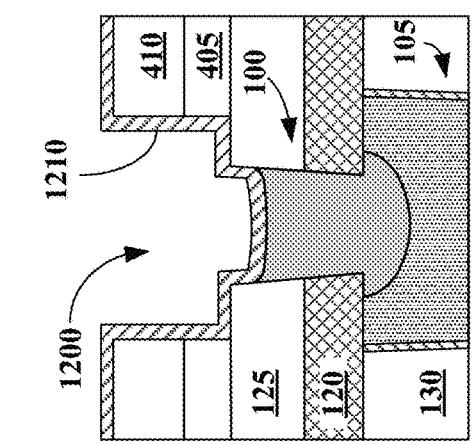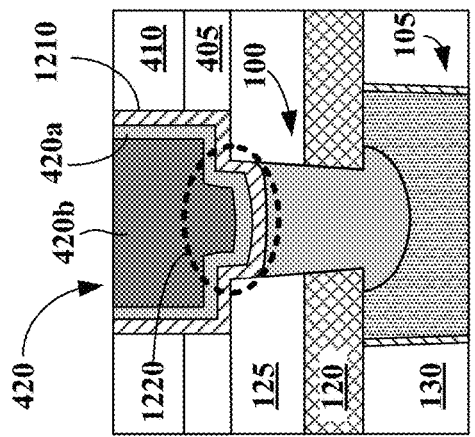

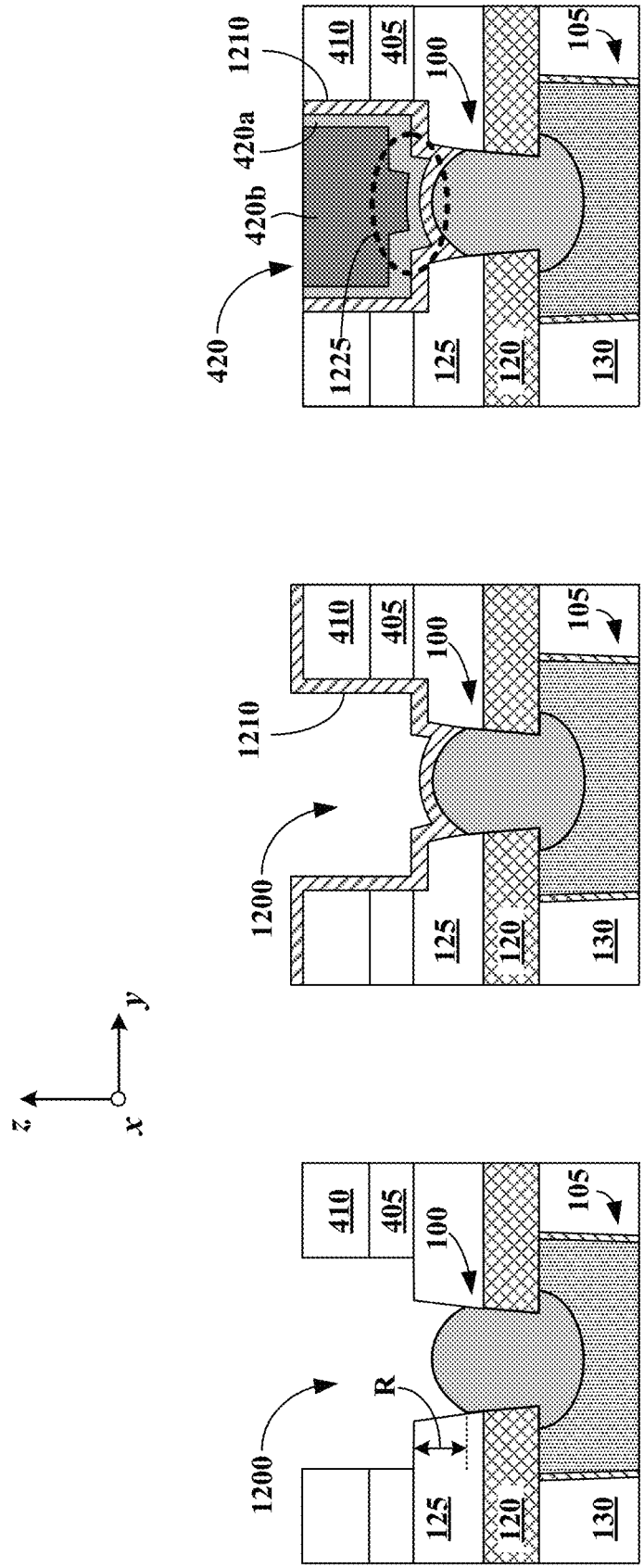

1300

```
┌─────────────────────────────────────────┐
│ Deposit an etch stop layer and a low-k  │
│ dielectric on a ruthenium conductive    │ ── 1305
│ structure                               │
└─────────────────────────────────────────┘
                   ▼
┌─────────────────────────────────────────┐
│ Etch an opening in the low-k dielectric │
│ and etch stop layer to expose the       │ ── 1310
│ ruthenium conductive structure          │
└─────────────────────────────────────────┘
                   ▼
┌─────────────────────────────────────────┐
│ Partially etch a dielectric layer       │
│ surrounding the ruthenium conductive    │ ── 1315
│ structure                               │
└─────────────────────────────────────────┘
                   ▼
┌─────────────────────────────────────────┐
│ Deposit a capping layer in the opening  │
│ and on the ruthenium conductive         │ ── 1320
│ structure                               │
└─────────────────────────────────────────┘
                   ▼
┌─────────────────────────────────────────┐
│ Form an upper metallization conductive  │
│ structure in the opening and on the     │ ── 1325
│ capping layer                           │
└─────────────────────────────────────────┘
```

Fig. 13

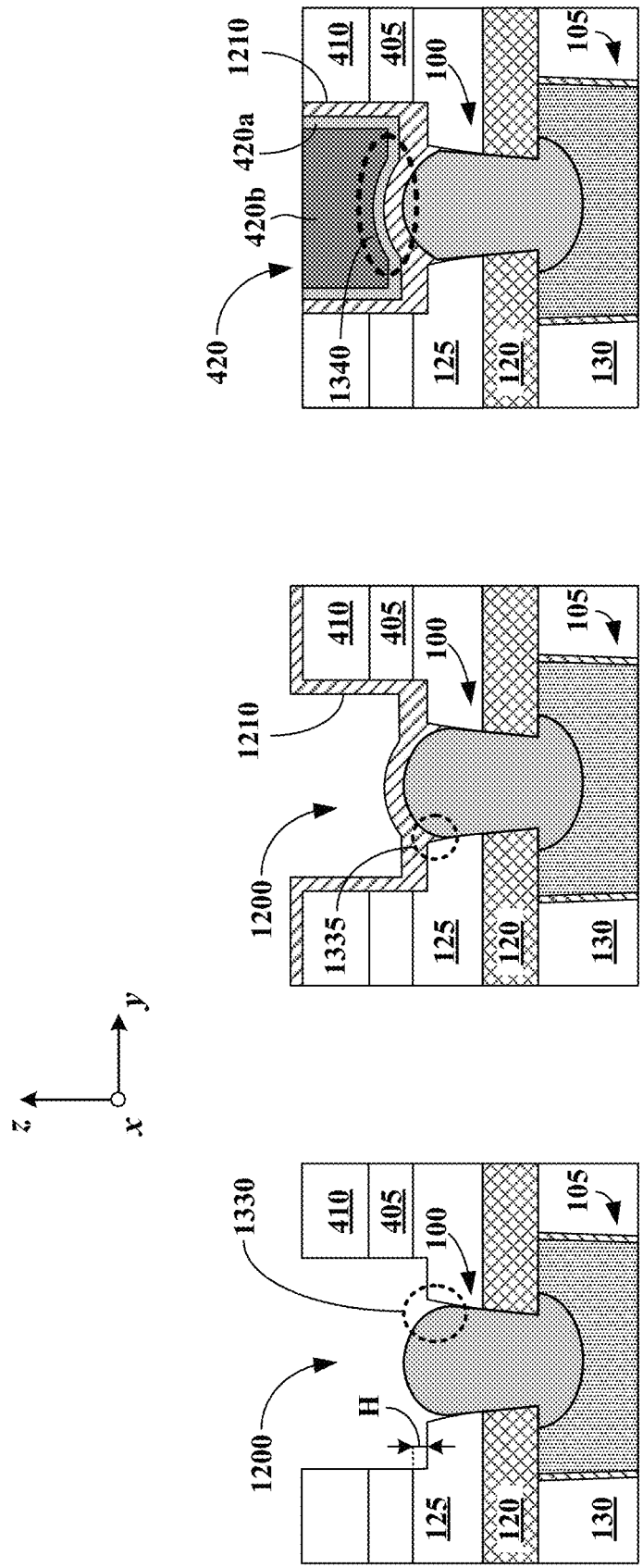

US 12,057,397 B2

CAPPING LAYER FOR LINER-FREE CONDUCTIVE STRUCTURES

CROSS-REFERENCE TO RELATED APPLICATION

This application is a continuation of U.S. patent application Ser. No. 17/141,445, titled "Capping Layers for Liner-Free Conductive Structures," filed Jan. 5, 2021, which claims the benefit of U.S. Provisional Patent Application No. 63/016,836, titled "Capping Layers for Ru/Co Metal System for Lower Contact Resistance," filed Apr. 28, 2020, each of which is incorporated herein by reference in its entirety.

BACKGROUND

In integrated circuits, conductive structures (e.g., metal contacts, vias, and lines) are electrically coupled to transistor regions, such as a gate electrode and source/drain terminals, to propagate electrical signals to and from the transistors. The conductive structures, depending on the complexity of the integrated circuit, can form multiple layers of metal wiring.

BRIEF DESCRIPTION OF THE DRAWINGS

Aspects of the present disclosure are best understood from the following detailed description when read with the accompanying figures.

FIG. 9 is a flowchart of a method for forming a capping layer on a liner-free or barrier-free conductive structure, in accordance with some embodiments.

FIGS. 12A-12I are cross-sectional views of intermediate structures during various fabrication operations for forming a capping layer on a liner-free or barrier-free conductive structure, in accordance with some embodiments.

FIG. 13 is a flowchart of a method for forming a capping layer on a liner-free or barrier-free conductive structure, in accordance with some embodiments.

FIGS. 14A-14C are cross-sectional views of intermediate structures during various fabrication operations for forming a capping layer on a liner-free or barrier-free conductive structure, in accordance with some embodiments.

DETAILED DESCRIPTION

Figure 1:
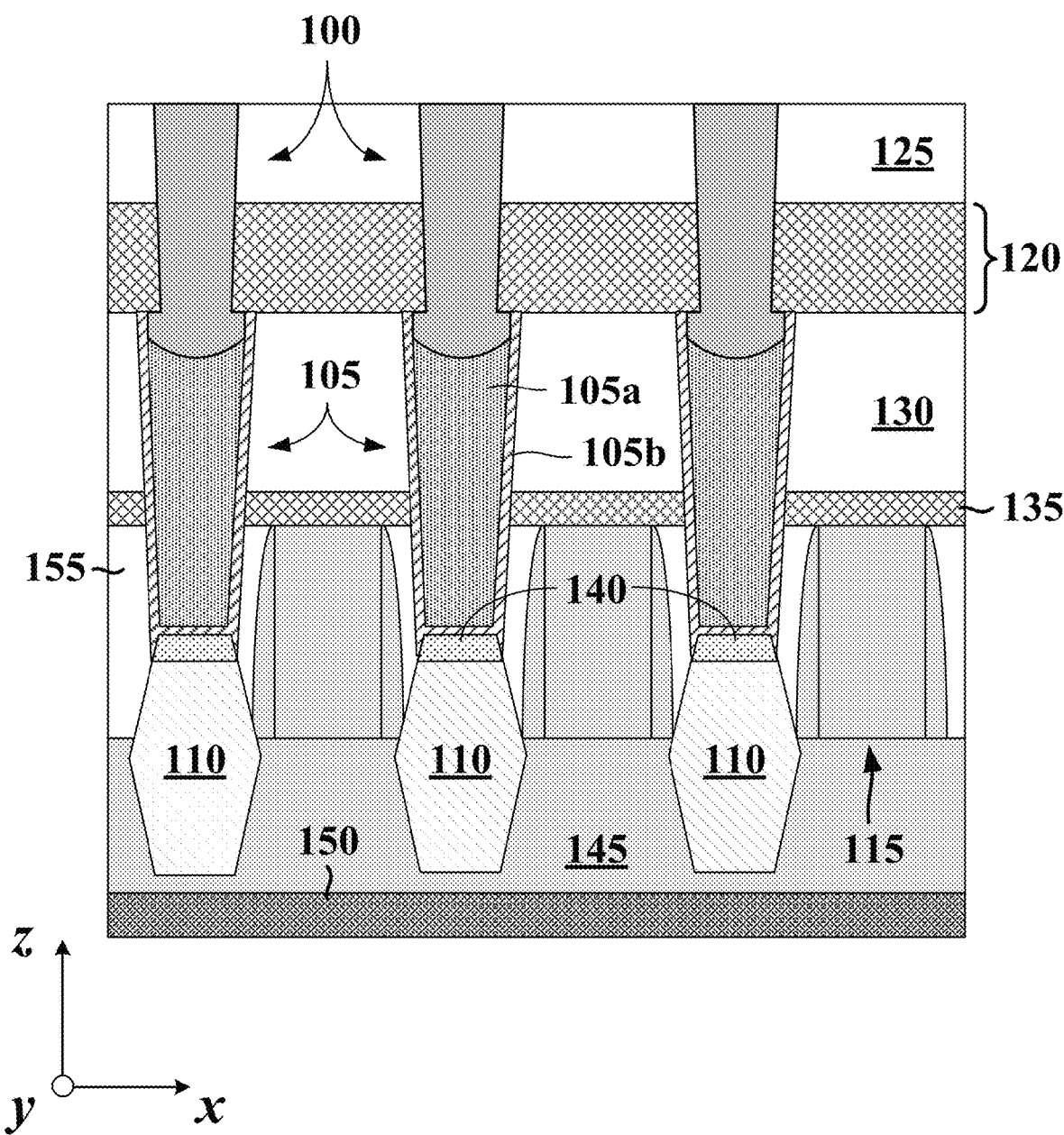
FIG. 1 is a partial cross-sectional view of a metallization layer with liner-free or barrier free conductive structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Active and passive devices in integrated circuits (IC) are connected at a local level (e.g., within the same area of the IC) and at a global level (e.g., between different areas of the IC) through a number of conductive structures, such as metal contacts, metal vias, and metal lines. These conductive structures—which can include different conductive materials (e.g., a different metal fill)—are formed in vertically stacked metallization (or interconnect) layers. Design considerations are taken into account when metallization layers with different conductive materials are stacked on top of each other to avoid performance degradation due to unwanted interaction between the conductive materials.

Conductive structures without barrier or liner layers (also referred to as "liner-free conductive structures" or "barrier-free conductive structures") can have a lower electrical resistance compared to conductive structures with barrier or liner layers. This is because liner or barrier layers, which can be more resistive than the metal fill layer in the conductive structures, consume valuable space within the conductive structure. Therefore, by eliminating the liner or barrier layers in the conductive structures, the lower resistance metal fill can occupy the entire volume of the conductive structure and reduce the overall contact resistance of the conductive structure.

At the same time, and due to the absence of a liner or a barrier layer, the liner-free or barrier-free conductive structures may be unable to prevent out-diffusion of metal atoms from underlying conductive structures when subjected to thermal processing. For example, ruthenium filled liner-free or barrier-free conductive structures formed directly on cobalt conductive structures may be unable to prevent cobalt out-diffusion when both structures are subjected to thermal processing. Out-diffused cobalt atoms can propagate via the ruthenium liner-free or barrier-free conductive structures to upper metallization layers. The out-diffused cobalt atoms can increase the contact resistance of the "host" conductive structure (e.g., of the ruthenium liner-free or barrier-free conductive structures and of the upper metallization layers such as copper wiring). Additionally, out-diffused cobalt atoms can result in voids within the cobalt conductive structure due to material migration. The aforementioned side effects of the thermally driven cobalt diffusion make the integration of ruthenium filled liner-free or barrier-free conductive structures challenging.

To address the aforementioned challenges, the embodiments described herein are directed to ruthenium capping layers, which are configured to prevent the migration of out-diffused cobalt atoms into the upper metallization layers (e.g., to copper wiring). In some embodiments, the capping layers are formed between a top surface of the ruthenium metal fill and the conductive structures of the upper metallization layers. In some embodiments, the capping layers described herein can also function as a barrier layer for the upper metallization layers. For example, the capping layers described herein can prevent copper electromigration. In some embodiments, the capping layer includes a pure metal or a metal nitride. In some embodiments, the capping layer has a low electrical resistivity (e.g., less than about 150 µΩ·cm), low solubility in ruthenium and cobalt, a melting point greater than about 600° C., and a formation temperature below about 400° C.

According to some embodiments, FIG. 1 is a partial cross-sectional view of a metallization or interconnect layer (also referred to herein as a "metallization layer") in an integrated circuit. By way of example and not limitation, the metallization layer of FIG. 1 includes liner-free conductive structures, such as ruthenium conductive structures 100, formed on source/drain (S/D) conductive structures, such as cobalt conductive structures 105. Cobalt conductive structures 105 are formed on S/D structures 110, which in turn are formed between gate structures 115. The layout of the aforementioned conductive structures is exemplary and not limiting. Other layouts of the aforementioned conductive structures are possible and within the spirit and the scope of this disclosure.

In some embodiments, ruthenium conductive structures 100 are formed directly on cobalt conductive structures 105 without the presence of intervening layers such as liner or barrier layers. Similarly, the ruthenium metal in ruthenium conductive structures 100 is formed directly on surrounding layers such as etch-stop layer (ESL) 120 and dielectric layer 125. In some embodiments, cobalt conductive structures 105 include cobalt metal 105a surrounded by liner layer 105b. As shown in FIG. 1, liner layer 105b surrounds sidewall and bottom surfaces of cobalt metal 105a. In some embodiments, liner layer 105b is a cobalt diffusion barrier that prevents cobalt diffusion towards surrounding materials, such as dielectric layer 130, ESL 135, gate structures 115, and S/D structures 110.

By way of example and not limitation, dielectric layers 125 and 130 can be interlayer dielectrics in which the aforementioned conductive structures are formed. In some embodiments, dielectric layers 125 and 130 include one or more silicon oxide based dielectrics deposited, for example, with a high-density chemical vapor deposition (HDCVD) process, a plasma-enhanced chemical vapor deposition process (PECVD), a plasma-enhanced atomic layer deposition process (PEALD), or any another suitable deposition process. By way of example and not limitation, dielectric layers 125 and 130 can be deposited at a thickness between about 100 nm and about 200 nm. The aforementioned deposition thickness ranges, deposition methods, and materials are exemplary and not limiting. Other materials, thickness ranges, or deposition methods can be used to form dielectric layers 125 and 130. These other materials, thickness ranges, or deposition methods are within the spirit and the scope of this disclosure.

In some embodiments, ESL 120 and 135 facilitate the formation of openings for the conductive structures in dielectric layers 125 and 130. The material selection for ESL 120 and 135 can be made, for example, from silicon nitride (SiNx), silicon oxide (SiOx), silicon oxynitride (SiON), silicon carbide (SiC), silicon carbo-nitride (SiCN), boron nitride (BN), silicon boron nitride (SiBN), silicon-carbon-boron-nitride (SiCBN), metal oxides, or combinations thereof. By way of example and not limitation, ESL 120 and 135 can be deposited with low-pressure chemical vapor deposition (LPCVD), PECVD, chemical vapor deposition (CVD), or any other suitable deposition process. In some embodiments, ESL 120 and 135 have a thickness between about 3 nm and about 30 nm.

As shown in FIG. 1, a silicide layer 140 is interposed between S/D structures 110 and cobalt conductive structures 105 to provide a low resistance path between cobalt conductive structures 105 and S/D structures 110. By way of example and not limitation, silicide layer 165 can include nickel platinum silicide (NiPtSi), nickel silicide (NiSi), titanium silicide (TiSi), cobalt silicide (CoSi), tungsten silicide (WSi), or any suitable silicide at a thickness of about 4 nm.

S/D structures 110 are formed in top portions of an active region 145. In some embodiments, active region 145 includes crystalline silicon (Si), germanium (Ge), a compound semiconductor (e.g., silicon carbide, gallium arsenide (GaAs), gallium phosphide (GaP), indium phosphide (InP), indium arsenide (InAs), indium antimonide (InSb)), an alloy semiconductor (e.g., SiGe, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP)), or combinations thereof. In some embodiments, active region 145 is a fin structure associated, for example, with one or more fin field-effect transistors (finFETs).

By way of example and not limitation, active region 145 can be formed on a substrate 180, which can include Si. Alternatively, substrate 180 can include Ge; a compound semiconductor, such as silicon carbide, GaAs, GaP, InP, InAs, and InSb; an alloy semiconductor, such as SiGe, GaAsP, AlInAs, AlGaAs, GaInAs, GaInP, and GaInAsP; or combinations thereof. In some embodiments, active region 145 is grown on substrate 180 or formed by etching substrate 180.

As shown in FIG. 1, lower portions of cobalt conductive structures 105 and gate structures 115 are surrounded by a bottom dielectric 155, which is in turn formed on active region 145 according to some embodiments.

Figure 2:
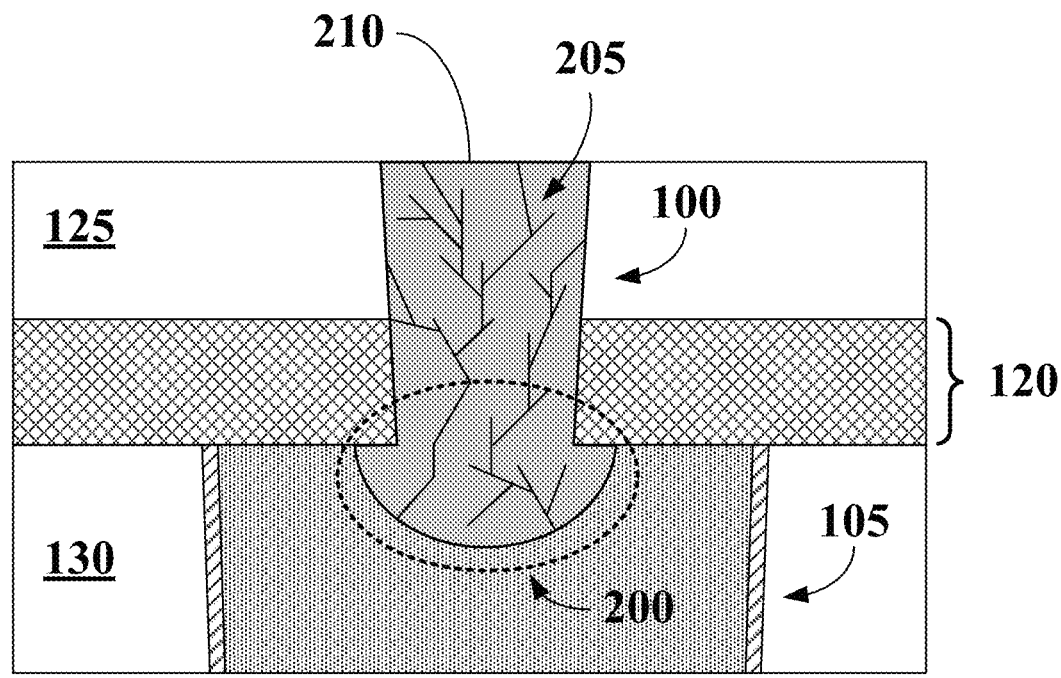
FIG. 2 is a partial cross-sectional view of a liner-free or barrier free conductive structure, in accordance with some embodiments
Figure 2:
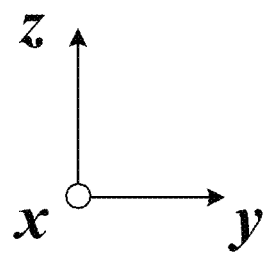

According to some embodiments, the partial cross-sectional view shown in FIG. 1 is viewed along the x-direction—e.g., parallel to the z-x plane. In some embodiments, cobalt conductive structures extend along the y-direction—e.g., in a direction perpendicular to the z-x plane shown in FIG. 1. By way of example and not limitation, the top width of cobalt conductive structures 105 along the x-direction can be substantially equal to the bottom width of ruthenium conductive structures 100 along the same direction as shown in FIG. 1. However, the width of cobalt conductive structures 105 along the y-direction can be greater than the bottom width of ruthenium conductive structures 100 along the same direction. This is shown in FIG. 2, which is a magnified partial cross-sectional view of a ruthenium conductive structure 100 along the y-direction. In the view of FIG. 2 (e.g., along the y-direction), additional features of ruthenium conductive structure 100 are visible—for example, a semi-spherical or arcuate shaped anchor 200 embedded in cobalt conductive structure 105. In some embodiments, the purpose of anchor 200 is twofold: (i) provide a larger contact area between ruthenium conductive structure 100 and the underlying cobalt conductive structure 105, and (ii) prevent damage to the ruthenium conductive structure 100 during a ruthenium planarization process. For example, ruthenium conductive structure 100 can be "pulled-out" during a planarization process.

As discussed above, ruthenium conductive structures 100 are formed directly on cobalt conductive structures 105 without the presence of intervening layers. For this reason, cobalt atoms can diffuse from cobalt conductive structures 105 towards ruthenium conductive structures 100 when the cobalt and ruthenium conductive structures are exposed to a thermal process, such as an annealing process or during the formation of additional layers or structures. In some embodiments, cobalt and ruthenium do not form an alloy; instead, cobalt atoms diffuse through the ruthenium grain boundaries 205. If not blocked at top surface 210 of ruthenium conductive structure 100, the out-diffused cobalt atoms may continue their "upward" migration to the upper metallization layers disposed on ruthenium conductive structures 100. These metallization layers are not shown in FIG. 2 for simplicity.

Figure 3:
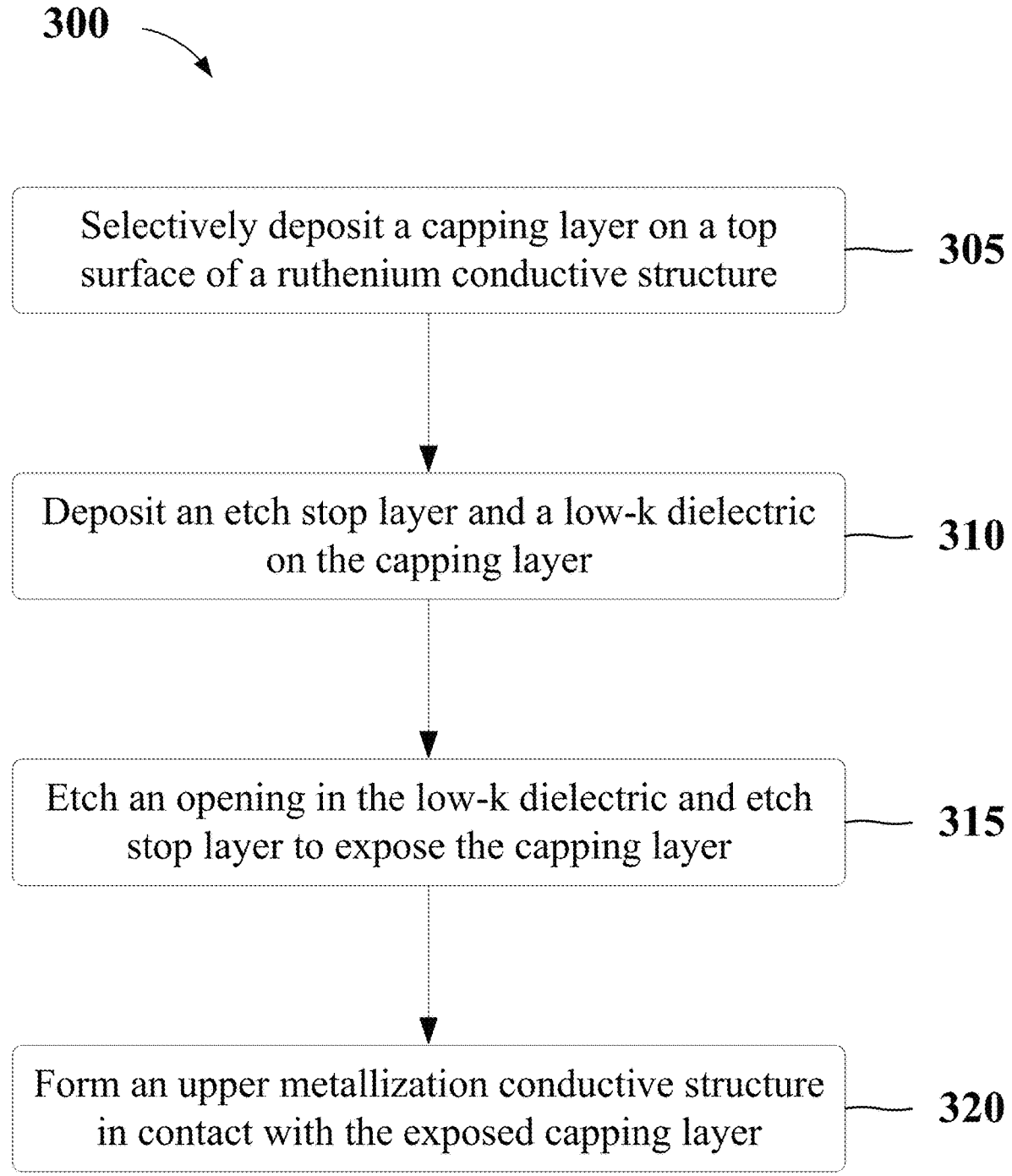
FIG. 3 is a flowchart of a method for forming a capping layer on a liner-free or barrier-free conductive structure, in accordance with some embodiments.

In some embodiments, FIG. 3 is a flowchart of a method 300 for the formation a capping layer on ruthenium conductive structures 100 to prevent out-diffused cobalt atoms from diffusing into the upper metallization layers, such as the copper metallization layers. Other fabrication operations may be performed between the various operations of method 300 and may be omitted merely for clarity and ease of description. These various operations are within the spirit and the scope of this disclosure. Additionally, not all operations may be required to perform the disclosure provided herein. Some of the operations may be performed simultaneously, or in a different order than those shown in FIG. 3. In some embodiments, one or more other operations may be performed in addition to or in place of the presently described operations.

In some embodiments, FIG. 2 can be an intermediate starting structure for method 300 and the subsequent methods described herein. In some embodiments, FIG. 2 shows ruthenium conductive structure 100 after a planarization process—e.g., after a chemical mechanical planarization (CMP) process.

In referring to FIG. 3, method 300 begins with operation 305 and the process of selectively depositing a capping layer on a top surface of a ruthenium conductive structure—for example, on a top surface 210 of ruthenium conductive structure 100 shown in FIG. 4A. In some embodiments, selective deposition of the capping layer on ruthenium conductive structures 100 can be achieved by appropriately selecting the capping layer material and tuning its deposition process so that the capping layer is not substantially formed on dielectric layer 125. In some embodiments, desirable attributes of the capping layer include, but are not limited to, an electrical resistivity less than about 150 μΩ·cm to minimize contact resistance degradation, a melting point greater than about 600° C. for improved thermal stability, and a formation temperature below about 400° C. to minimize thermally driven cobalt out-diffusion. In some embodiments, the capping layer does not chemically react with ruthenium and cobalt and does not form ruthenium or cobalt alloys.

In some embodiments, the capping layer is a metal, such as tungsten, deposited with a chemical vapor deposition (CVD) process at a temperature range between about 300° C. and about 400° C. at a process pressure between about 1 Torr and about 10 Torr. In some embodiments, the tungsten deposition includes tungsten hexafluoride ($WF_6$) chemistry and hydrogen ($H_2$) to selectively form tungsten metal on top surface 210 of ruthenium conductive structure 100. In some embodiments, the thickness of the capping layer formed on ruthenium conductive structure 100 ranges between 1.5 nm and 10 nm. In some embodiments, the thickness of the capping layer on dielectric layer 125 is substantially zero.

In some embodiments, a deposition temperature below about 400° C. promotes the deposition selectivity and mitigates the thermally driven cobalt out-diffusion. For example, deposition temperatures higher than about 400° C. can promote the deposition of tungsten on dielectric layer 125. Further, deposition temperatures higher than about 400° C. can accelerate the cobalt out-diffusion towards and within ruthenium conductive structure 100. On the other hand, deposition temperatures less than about 300° C. are not sufficient to form appreciable amounts of tungsten on ruthenium conductive structures 100.

In some embodiments, capping layers thinner than about 1.5 nm are unable to block or prevent cobalt out-diffusion from ruthenium conductive structure 100, and capping layers thicker than about 10 nm can adversely impact the combined resistance of the conductive structure. This is because the capping layer (e.g., a tungsten capping layer) is more resistive than both ruthenium and cobalt.

In some embodiments, FIG. 4B shows a tungsten capping layer 400 selectively formed on ruthenium conductive structure 100 according to operation 305 of method 300. As shown in FIG. 4B, capping layer 400 covers the top surface of ruthenium conductive structure 100 along the y-direction and overlaps with portions M of dielectric layer 125 surrounding ruthenium conductive structure 100. Capping layer 400 has a base that is wider than the width of ruthenium conductive structure 100 in the x- and y-directions. In some embodiments, capping layer 400 has a dome shape (e.g., the upper surface of capping layer 400 is convex). Further, capping layer 400 is substantially self-aligned to the top surface of ruthenium conductive structure 100 so that capping layer 400 does not substantially cover top surfaces of dielectric layer 125 with the exception of portions M of dielectric layer 125 shown in FIG. 4B. In some embodiments, the dome-like shape of capping layer 400 is attributed to the growth kinetics of the selective tungsten deposition process described above. In some embodiments, thickness T of capping layer 400 is measured from the apex of the dome to top surface 210 of ruthenium conductive structure 100 and measures between about 1.5 nm and 10 nm as discussed above.

In referring to FIG. 3, method 300 continues with operation 310 and the process of deposing an etch-stop layer (ESL) and a low-k dielectric on capping layer 400. By way of example and not limitation, FIG. 4C shows the structure of FIG. 4B after the deposition of ESL 405 and low-k dielectric 410 on capping layer 400 according to operation 310 of method 300. In some embodiments, ESL 405 follows the contour of capping layer 400 and facilitates the formation of conductive structures in upper metallization layer as discussed below. In some embodiments, ESL 405 is not in physical contact with ruthenium conductive structure 100 since capping layer 400 is interposed between ESL 405 and ruthenium conductive structure 100. In some embodiments, upper surfaces of capping layer 400 are covered by ESL 405, as shown in FIG. 4C.

By way of example and not limitation, ESL 405 ESL includes $SiN_x$, $SiO_x$, SiON, SiC, SiCN, BN, SiBN, SiCBN, or a combination thereof. Further, ESL 405 can have a thickness between about 3 nm and about 30 nm.

By way of example and not limitation, low-k dielectric 410 has a dielectric constant (k-value) less than about 3.9 (e.g., about 3 or less) and can include a stack of dielectric layers such as a low-k dielectric and another dielectric. For example, a low-k dielectric (e.g., carbon doped silicon oxide) and a silicon carbide with nitrogen doping, a low-k dielectric (e.g., carbon doped silicon oxide) and a silicon carbide with oxygen doping, a low-k dielectric (e.g., carbon doped silicon oxide) with silicon nitride; or a low-k dielectric (e.g., carbon doped silicon oxide) with silicon oxide. In some embodiments, low-k dielectric 410 is a porous material. By way of example and not limitation, low-k dielectric 410 can be deposited with a high-density chemical vapor deposition (HDCVD) process, a plasma-enhanced chemical vapor deposition process (PECVD), a plasma-enhanced atomic layer deposition process (PEALD), or any another suitable deposition process at a thickness between about 100 nm and about 200 nm.

The aforementioned deposition thickness ranges, deposition methods, and materials for ESL 405 and low-k dielectric 410 are exemplary and not limiting. Therefore, alternative materials, thickness ranges, or deposition methods can be used and are within the spirit and the scope of this disclosure.

In referring to FIG. 3, method 300 continues with operation 315 and the process of etching an opening in low-k dielectric 410 and ESL 405 to exposed capping layer 400. By way of example and not limitation, the opening can be formed with a patterning process that includes photolithography and one or more etching operations. For example, a photoresist (not shown) can be deposited, photo-exposed, and patterned to form an etching mask (not shown) on low-k dielectric 410. An etching operation can be subsequently used to remove portions of low-k dielectric 410 and ESL 405 not covered by the patterned photoresist to form opening 415 shown in FIG. 4D. In some embodiments, opening 415 traverses through low-k dielectric 410 and ESL 405 to expose capping layer 400 as shown in FIG. 4D. In some embodiments, top and sidewall surfaces of ruthenium conductive structure 100 are not exposed by opening 415 as shown in FIG. 4D; for example, dielectric layer 125 is not recessed during the formation of opening 415.

In some embodiments, opening 415 partially exposes top surfaces of capping layer 400 as shown in FIG. 4D'. In this case, ESL 405 continues to cover portions of capping layer 400 after the formation of opening 415. In some embodiments, capping layer 400 is partially embedded (e.g., surrounded) by un-etched portions of ESL 405.

By way of example and not limitation, the etching process used for the formation of opening 415 can be a two-step process during which low-k dielectric 410 and ESL 405 are sequentially etched using different dry etching chemistries. In some embodiments, the etching chemistry used to etch ESL 405 does not substantially etch dielectric layer 125 and capping layer 400.

In some embodiments, opening 415 is formed with a width along the y-direction larger than a top width of ruthenium conductive structure 100 along the same direction as shown in FIGS. 4D and 4D'. For example, opening 415 can be wider than ruthenium conductive structure 100 and capping layer 400 in the y-direction.

In some embodiments, the width of opening 415 along the y-direction can be substantially equal to the width of capping layer 400 along the same direction. In some embodiments, opening 415 and conductive structure 100 can have substantially the same or different width along the x-direction. For example, the width of opening 415 can be substantially equal to or larger than the width of conductive structure 100 along the x-direction.

In some embodiments, after the formation of opening 415, the photoresist mask is removed from low-k dielectric 410 with a wet etching process. In some embodiments, FIGS. 4D and 4D' show the resulting structure after the formation of opening 415 and the removal of the photoresist mask from low-k dielectric 410.

Figure 4E:
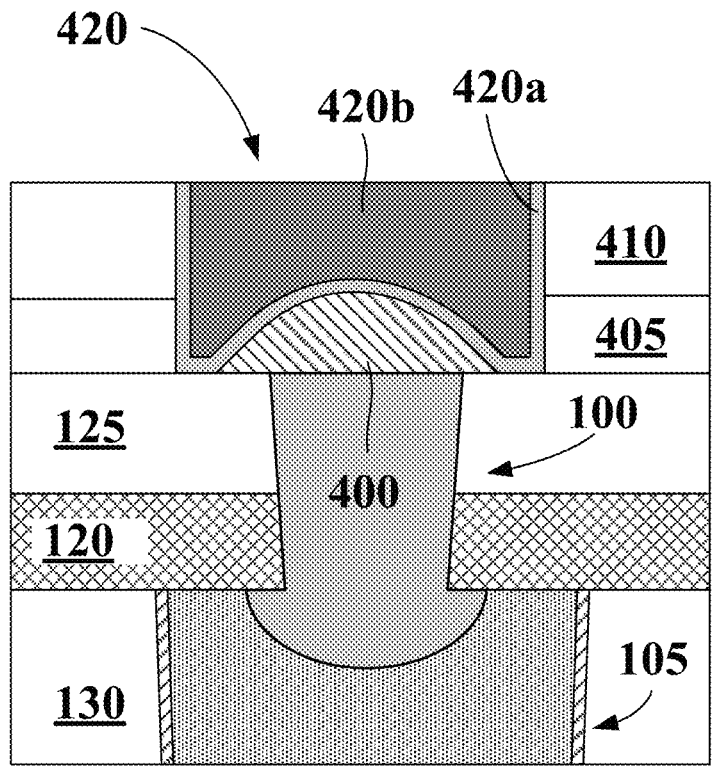
FIGS. 4A-4D, 4D', 4E, and 4E' are cross-sectional views of intermediate structures during various fabrication operations for forming a capping layer on a liner-free or barrier-free conductive structure, in accordance with some embodiments.
Figure 4E:
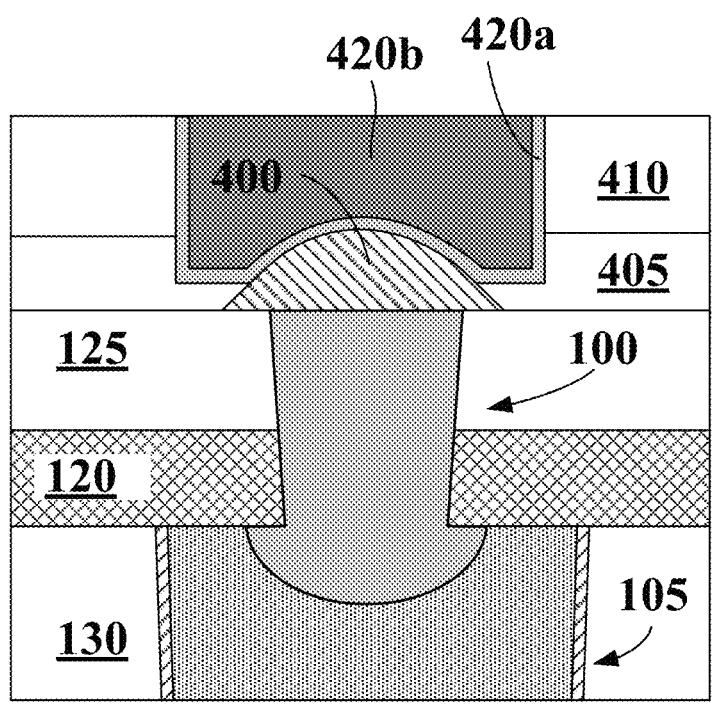

In referring to FIG. 3, method 300 continues with operation 320 and the process of forming an upper metallization conductive structure in contact with the exposed capping layer 400. In some embodiments, the upper metallization conductive structure includes a barrier layer, a low resistance liner layer, a seed layer, and a metal fill. By way of example and not limitation, the barrier layer can be a sputter deposited tantalum nitride (TaN) layer, the low resistance liner layer can be a sputter deposited tantalum (Ta) layer, the seed layer can be a sputter deposited copper (Cu) seed layer, and the metal fill can be electroplated Cu. According to some embodiments, FIG. 4E shows the structures of FIG. 4D after the formation of upper metallization conductive structure 420, which includes barrier layer 420a and metal fill 420b. According to some embodiments, FIG. 4E' shows the structures of FIG. 4D' after the formation of upper metallization conductive structure 420, which includes barrier layer 420a and metal fill 420b. The low resistance liner layer and the seed layer of upper metallization conductive structure 420 are not shown in FIGS. 4E and 4E' for simplicity. In some embodiments, upper metallization conductive structure 420 is a back-end-of-line (BEOL) structure, such as via or a line.

In some embodiments, barrier layer 420a follows the curvature of capping layer 400 as shown in FIGS. 4E and 4E'. According to some embodiments, a difference between FIGS. 4E and 4E' is that in FIG. 4E' barrier layer 420a covers portions of capping layer 400 exposed by opening 415 shown in FIG. 4D'. Other portions of barrier layer 420 are embedded in ESL 405 as discussed above.

In some embodiments, additional upper metallization conductive structures, similar to or different from upper metallization conductive structure 420 can be formed on each ruthenium conductive structure 100. In some embodiments, tungsten capping layer 400 prevents or blocks cobalt atoms from diffusing into upper metallization conductive structure 420 during subsequent thermal operations, such as annealing operations or layer formation operations that involve thermal processing.

Figure 5:
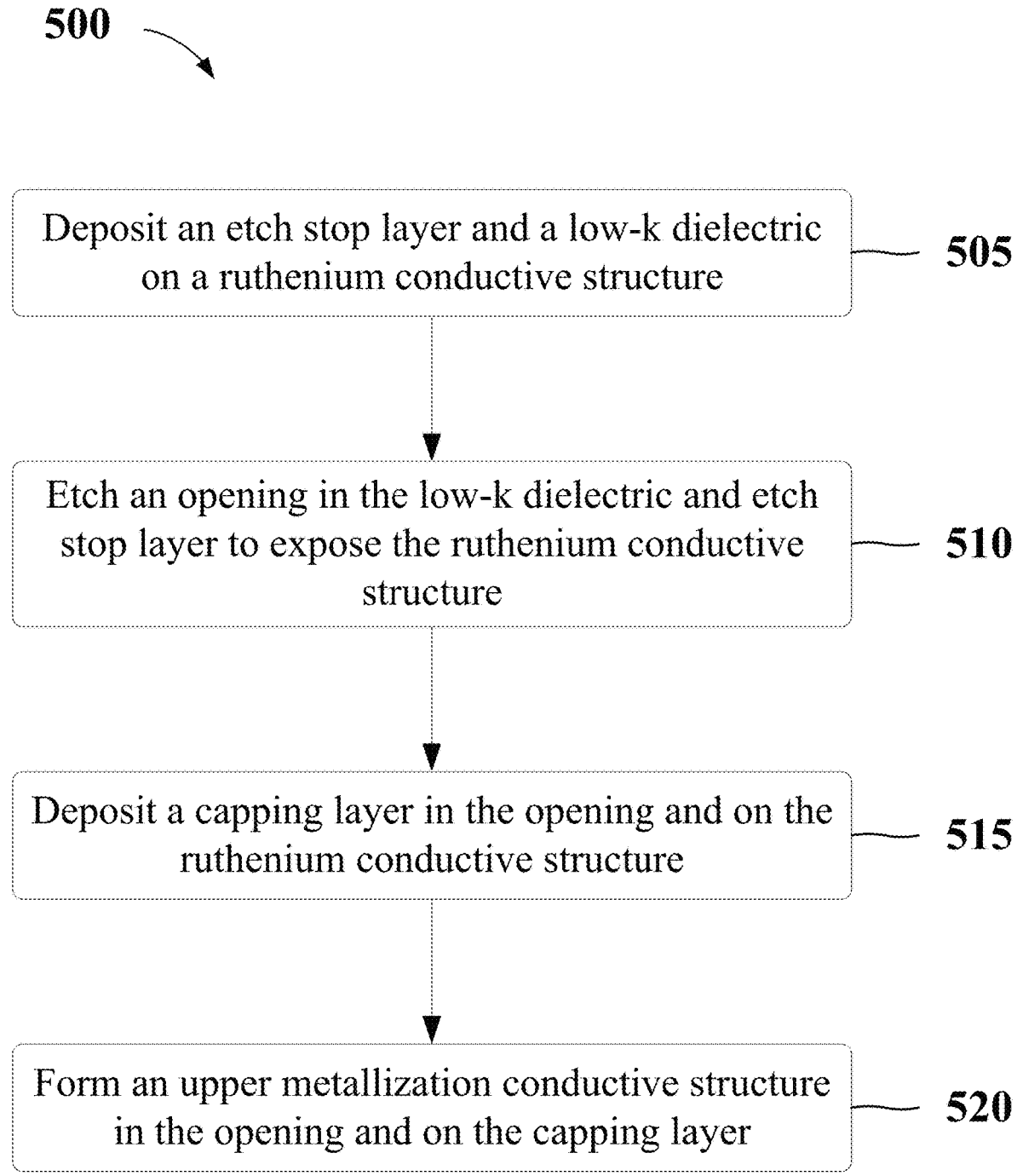
FIG. 5 is a flowchart of a method for forming a capping layer on a liner-free or barrier-free conductive structure, in accordance with some embodiments.

In some embodiments, FIG. 5 is a flowchart of a method 500 for the formation a capping layer between ruthenium conductive structures 100 and an upper metallization conductive structure. Other fabrication operations may be performed between the various operations of method 500 and may be omitted merely for clarity and ease of description. These various operations are within the spirit and the scope of this disclosure. Additionally, not all operations may be required to perform the disclosure provided herein. Some of the operations may be performed simultaneously, or in a different order than those shown in FIG. 5. In some embodiments, one or more other operations may be performed in addition to or in place of the presently described operations.

Figure 6A:
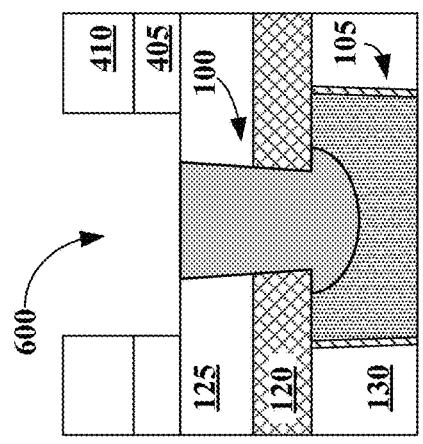
FIGS. 6A-6E are cross-sectional views of intermediate structures during various fabrication operations for forming a capping layer on a liner-free or barrier-free conductive structure, in accordance with some embodiments.
Figure 6B:
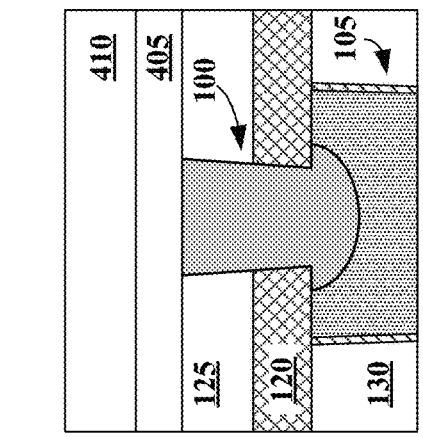

In referring to FIGS. 5 and 6A, method 500 begins with operation 505 and the process of depositing an etch stop layer and a low-k dielectric on ruthenium conductive structure 100. In some embodiments, the difference between operation 505 shown in FIG. 5 and operation 310 of method 300 shown in FIG. 3 is that in operation 505, ESL 405 and low-k dielectric 410 are deposited directly on top surface 210 of ruthenium conductive structure 100 and not on a capping layer formed in a prior operation. FIG. 6B shows the resulting structure after operation 505.

Figure 6C:
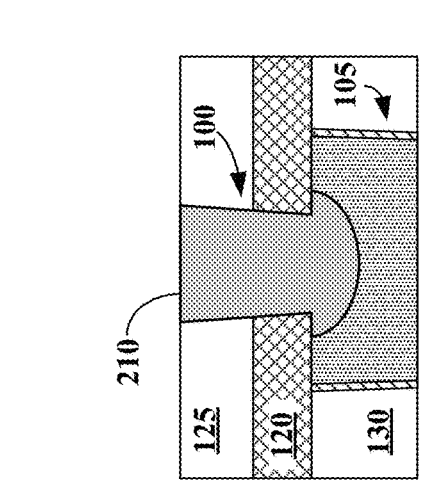

In referring to FIGS. 5 and 6C, method 500 continues with operation 510 and the process of etching an opening 600 in low-k dielectric 410 and ESL 405 to exposed ruthenium conductive structure 100. According to some embodiments, operation 510 is similar to operation 315 of method 300 discussed above. However, the difference between opening 415 and opening 600 is that opening 600 exposes the top surface of ruthenium conductive structure 100 instead of a capping layer. In some embodiments, the dimensions of opening 600 are similar to those of opening 415 discussed above.

Figure 6E:
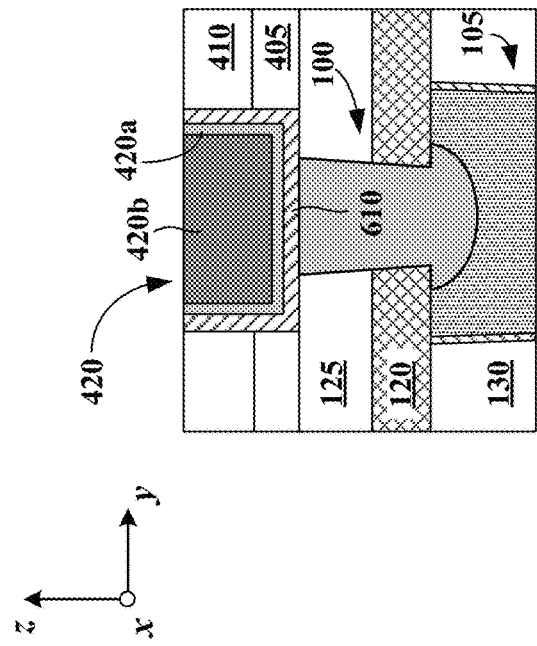
Figure 6D:
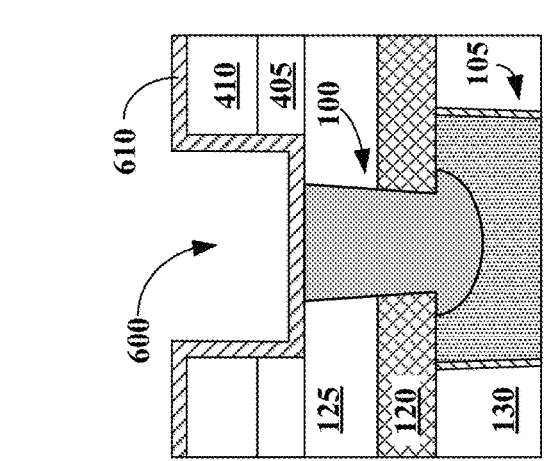

In referring to FIGS. 5 and 6D, method 500 continues with operation 515 and the process of depositing a capping layer 610 in opening 600 and on ruthenium conductive structure 100. In some embodiments, the deposited capping layer 610 follows the topography of opening 600. For example, capping layer 610 is conformally deposited in opening 600 to cover sidewall and bottom surfaces of opening 600 as shown in FIG. 6D. In some embodiments, capping layer 610 does not fill opening 600 and extends over top surfaces of low-k dielectric 410. By way of example and not limitation, capping layer 610 can be deposited with an atomic layer deposition (ALD) process, a CVD process, or another suitable process capable of depositing conformal capping layers. In some embodiments, capping layer 600 includes a W layer, a titanium nitride (TiN) layer, or a TaN layer.

By way of example and not limitation, W can be deposited with a CVD process using a mixture of $WF_6$ and $H_2$ at a process pressure higher than about 10 Torr. W can be deposited with an ALD process using $WF_6$ and diborine ($H_2B_6$). Both the CVD and ALD deposited W layers can be formed at a temperature range between about 300° C. and about 400° C. By way of example and not limitation, TiN layers can be deposited with a CVD or an ALD process using titanium tetrachloride ($TiCl_4$) and ammonia ($NH_3$) plasma at a temperature range between about 300° C. and about 400° C. TaN layers can be deposited with a CVD or an ALD process using tantalum tetrachloride ($TaCl_4$) and ammonia ($NH_3$) plasma at a temperature range between about 300° C. and about 400° C. In some embodiments, the thickness of capping layer 610 ranges between about 1.5 nm and about 10 nm.

In referring to FIGS. 5 and 6E, method 500 continues with operation 520 and the process of forming an upper metallization conductive structure 420 in opening 600 and on capping layer 610. In some embodiments, operation 520 is similar to operation 320 of method 300 shown in FIG. 3. Since there is no surface topography for capping layer 610 along the bottom surface of opening 600, upper metallization conductive structure 420 is formed without a step feature as shown in FIG. 4E. For example, method 500 produces an upper metallization conductive structure with a planar bottom surface.

In some embodiments, if capping layer 610 is selected to be a TaN layer as described above, barrier layer 420a of metallization conductive structure 420 can be optionally formed depending on the deposited thickness of the TaN capping layer. For example, if capping layer 610 is sufficiently thick (e.g., thicker than about 1.5 nm) to block both cobalt and copper atoms, barrier layer 420a can be omitted. On the other hand, if capping layer 610 is not sufficiently thick (e.g., thinner than about 1.5 nm) to block both cobalt and copper atoms, a barrier layer 420a (e.g., a TaN layer) can be deposited via PVD on the CVD or ALD deposited TaN capping layer (e.g., capping layer 610).

In some embodiments, additional upper metallization conductive structures, similar to or different from upper metallization conductive structure 420 can be formed on each ruthenium conductive structure 100. In some embodiments, capping layer 610 prevents or blocks cobalt atoms from diffusing into upper metallization conductive structure 420 during subsequent thermal operations, such as annealing operations or layer formation operations that involve thermal processing.

Figure 7:
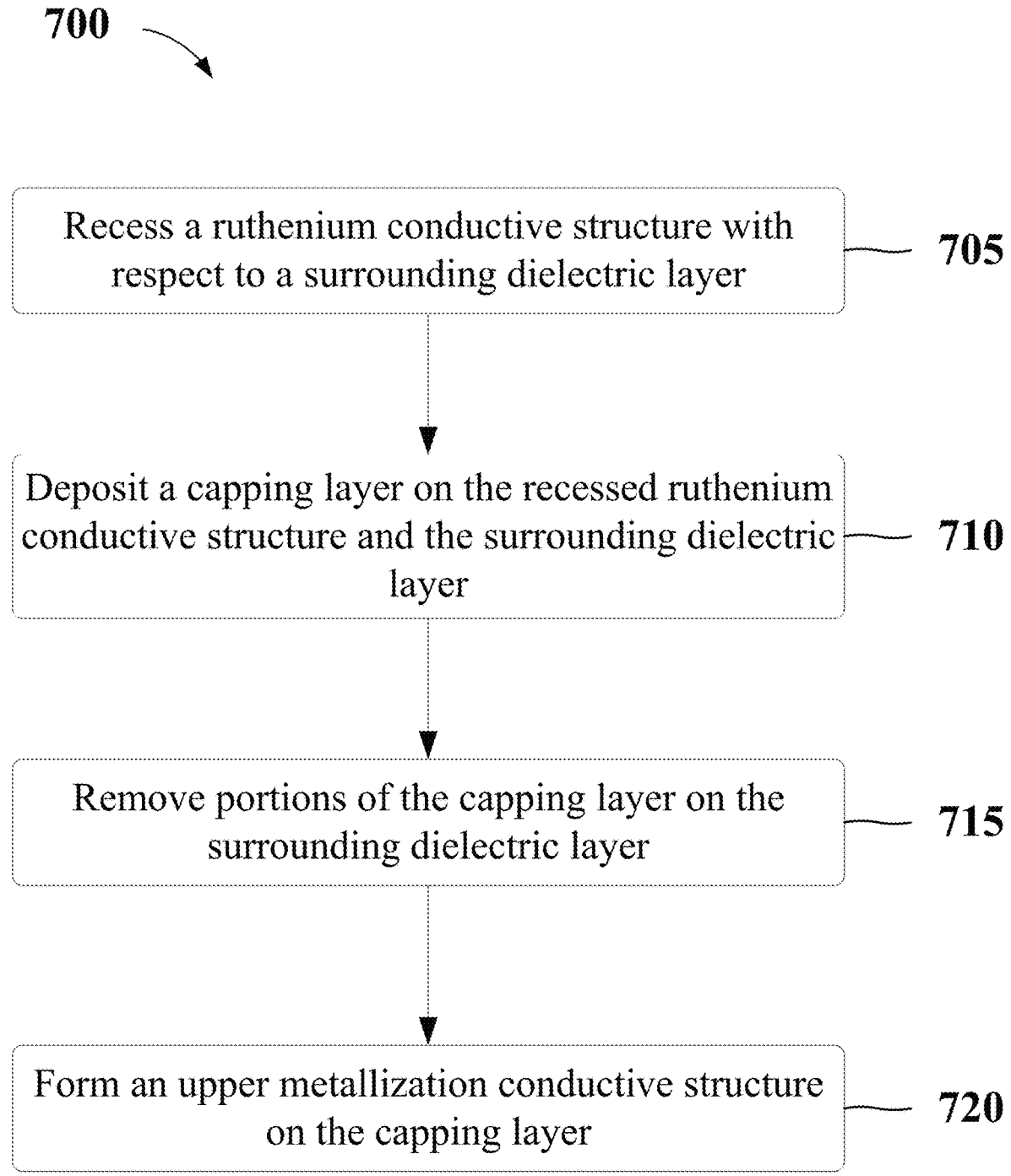
FIG. 7 is a flowchart of a method for forming a capping layer on a liner-free or barrier-free conductive structure, in accordance with some embodiments.

In some embodiments, FIG. 7 is a flowchart of a method 700 for the formation a capping layer between ruthenium conductive structures 100 and an upper metallization conductive structure. Other fabrication operations may be performed between the various operations of method 700 and may be omitted merely for clarity and ease of description. These various operations are within the spirit and the scope of this disclosure. Additionally, not all operations may be required to perform the disclosure provided herein. Some of the operations may be performed simultaneously, or in a different order than those shown in FIG. 7. In some embodiments, one or more other operations may be performed in addition to or in place of the presently described operations.

Figure 8A:
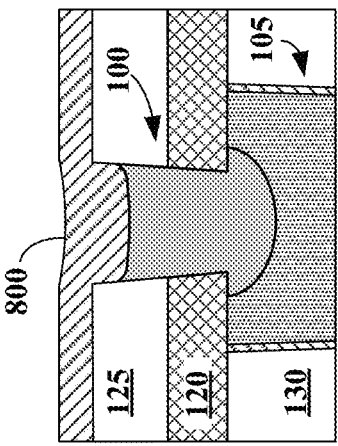
FIGS. 8A-8K are cross-sectional views of intermediate structures during various fabrication operations for forming a capping layer on a liner-free or barrier-free conductive structure, in accordance with some embodiments.
Figure 8B:
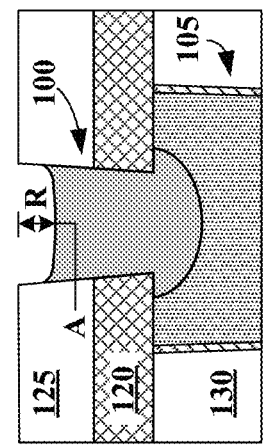

In referring to FIGS. 7 and 8A, method 700 begins with operation 705 and the process of recessing ruthenium conductive structure 100 with respect to surrounding dielectric layer 125. According to some embodiments, FIG. 8B shows ruthenium conductive structure 100 after operation 705. In some embodiments, ruthenium conductive structure 100 is recessed with a selective etch-back process. In some embodiments, a recess height R can be controlled via the etch-back process conditions, such as the etching time. According to some embodiments, recess height R is equal to or less than about 5 nm to prevent excess removal of low resistance ruthenium metal, high contact resistance, and performance degradation. In some embodiments, the selective etch-back process includes a wet etching chemistry, such as hypochlorous acid (HClO), which does not substantially etch dielectric layer 125. In some embodiments, the etch-back process due to its isotropic nature forms a top surface for ruthenium conductive structure 100 with a substantially planar middle portion and a raised edge portion as shown in FIG. 8B. In some embodiments, recess height R is measured from a point A of a horizontal portion of the ruthenium conductive structure to the top surface of dielectric layer 125, as shown in FIG. 8B. In some embodiments, point A is located in the middle of ruthenium conductive structure 100.

Figure 8C:
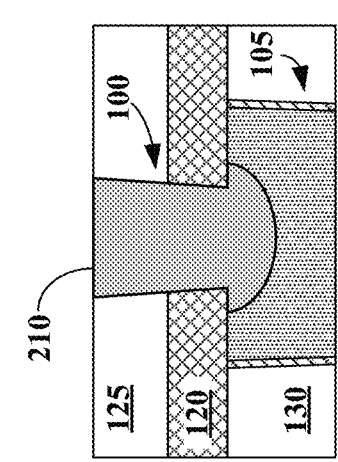

In referring to FIGS. 5 and 8C, method 700 continues with operation 710 and the process of depositing a capping layer 800 on the recessed ruthenium conductive structure 100 and surrounding dielectric layer 125. In some embodiments, capping layer 800 is blanket deposited so that it fills the recess formed by operation 705 as shown in FIG. 8C. By way of example and not limitation, capping layer 800 can be deposited with a CVD or PVD deposition process and include W, TiN, or TaN. For example, CVD W can be deposited using WF6 and H2 in a temperature range between 300° C. and 400° C. at a process pressure higher than about 10 Torr. By way of example and not limitation, PVD TiN can be deposited by sputtering Ti metal and subsequently exposing the sputtered metal to a nitrogen-based plasma (e.g., a nitrogen plasma or an ammonia plasma). Similarly, PVD TaN can be deposited by sputtering Ta metal and subsequently exposing the sputtered metal to a nitrogen-based plasma (e.g., a nitrogen plasma or an ammonia plasma). In some embodiments, capping layer 800 is deposited at a thickness between about 1.5 nm and about 5 nm to mitigate the impact on contact resistance and provide adequate protection against cobalt diffusion.

Figure 8D:
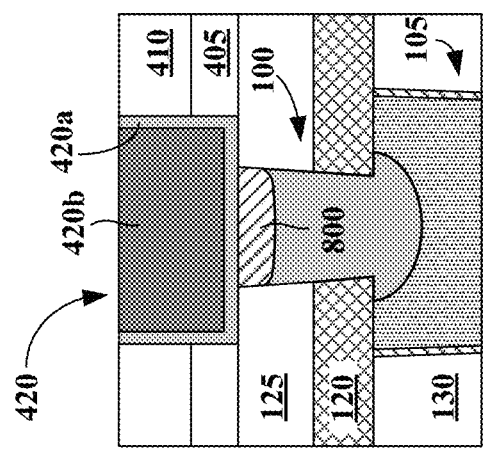

In referring to FIGS. 5 and 8D, method 700 continues with operation 715 and the process of removing portions of capping layer 800 from top surfaces of dielectric layer 125. By way of example and not limitation, capping layer 800 can be removed with a planarization process, such as a CMP process. In some embodiments, after the removal of capping layer 800 from dielectric layer 125, top surfaces of capping layer 800 and dielectric layer 125 are substantially coplanar as shown in FIG. 8D. Further, capping layer 800 substantially fills the area between the top surface of recessed ruthenium conductive structure 100 and the top surface of dielectric layer 125. Since the top surface of ruthenium conductive structure 100 is not planar, the thickness of capping layer can 800 can vary between the middle and sidewall portions of ruthenium conductive structure 100. For example, in referring to FIG. 8D, capping layer 800 has a thickness $T_1$ towards the center of ruthenium conductive structure 100 (e.g., above point A) that is greater than a thickness $T_2$ towards the vertical sidewalls of ruthenium conductive structure 100 (e.g., $T_1 > T_2$). In some embodiments, a ratio between $T_1/T_2$ can be greater than about 1 and less than about 2. In some embodiments, $T_1$ is substantially equal to recess height R (e.g., $T_1 = R$) shown in FIG. 8B.

Figure 8E:
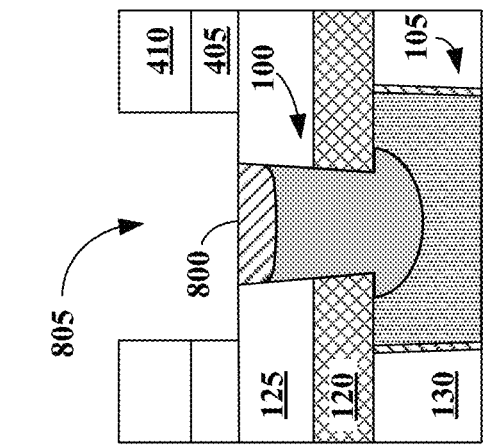

In referring to FIG. 7 method 700 continues with operation 720 and the process of forming an upper metallization conductive structure on capping layer 800. In some embodiments, the formation of upper metallization conductive structure includes, for example, depositing and subsequently patterning ESL 405 and low-k dielectric 410 to form an opening 805 that exposes capping layer 800 as shown in FIG. 8E. Further, depositing a barrier layer 420a and metal fill 420b to form upper metallization conductive structure 420 shown in FIG. 8F and discussed previously with respect to FIGS. 4E and 6E. In some embodiments, opening 805 is similar to openings 415 and 600 shown in FIGS. 4D and 6D.

Figure 8F:
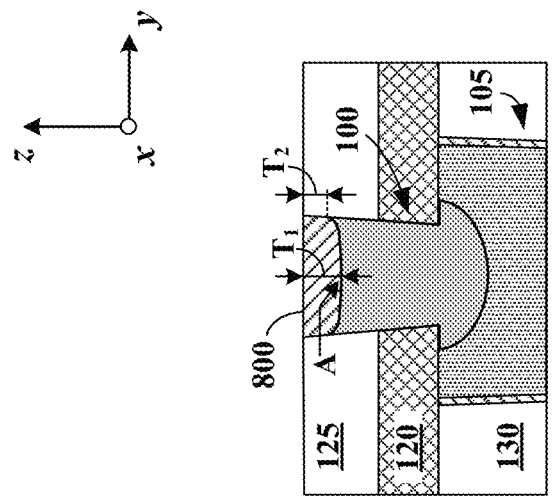

Similar to upper metallization conductive structure 420 shown in FIG. 6E, upper metallization conductive structure 420 in FIG. 8F has a planar bottom topography.

In some embodiments, additional upper metallization conductive structures, similar to or different from upper metallization conductive structure 420 can be formed on each ruthenium conductive structure 100. In some embodiments, capping layer 800 prevents or blocks cobalt atoms from diffusing into upper metallization conductive structure 420 during subsequent thermal operations, such as annealing operations or layer formation operations that involve thermal processing.

In some embodiments, the selective etch-back process of operation 705 leaves ruthenium conductive structure 100 with a concave top surface as shown in FIG. 8E. In this case, recess height R is measured between a sidewall top surface of ruthenium conductive structure 100 and a top surface of dielectric layer 125 as shown in FIG. 8E. In some embodiments, recess height R is equal to or less than about 5 nm to prevent excess removal of low resistance ruthenium metal, high contact resistance, and performance degradation. In some embodiments, the selective etch-back process includes an etching process that does not substantially etch dielectric layer 125. For example, the etching process can include ion bombardment processes and plasma etching processes that are performed while a voltage bias is applied to the substrate.

Figure 8I:
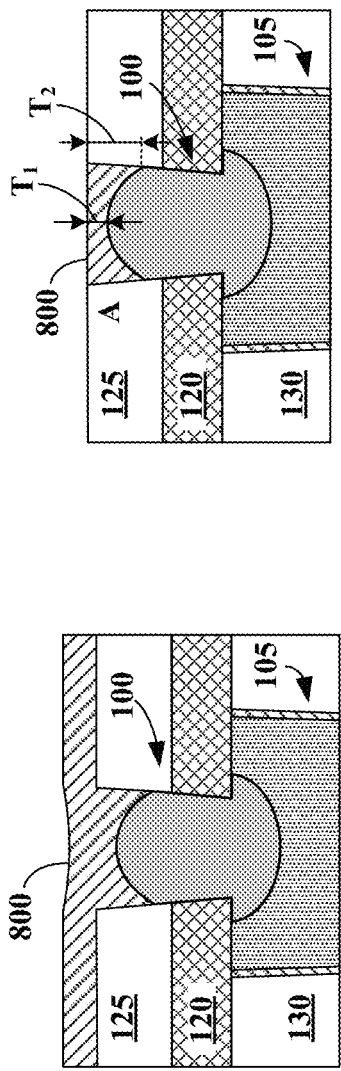
Figure 8K:
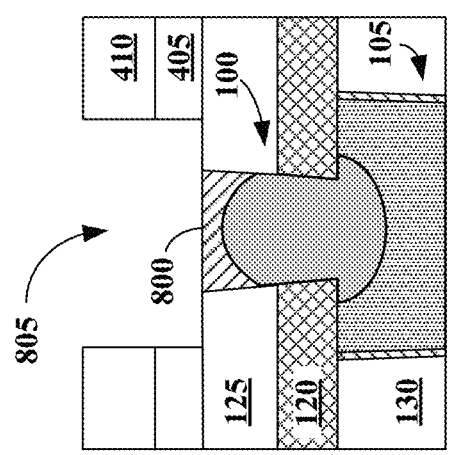
Figure 8H:
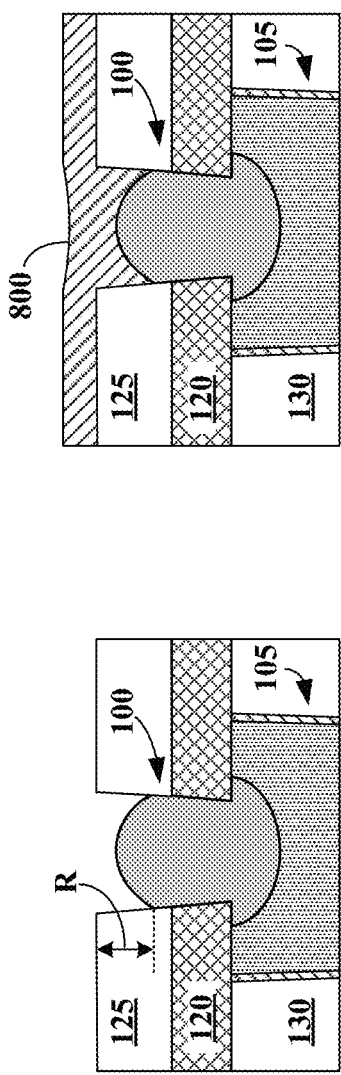
Figure 8J:
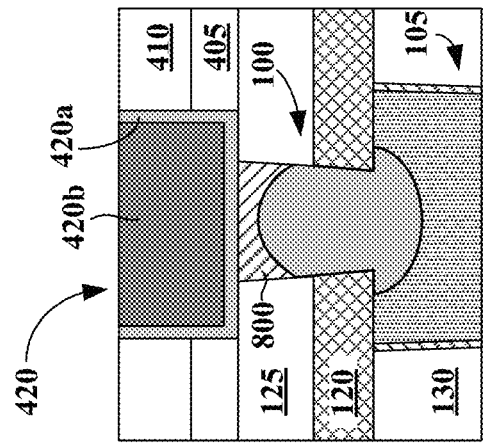
Figure 8G:
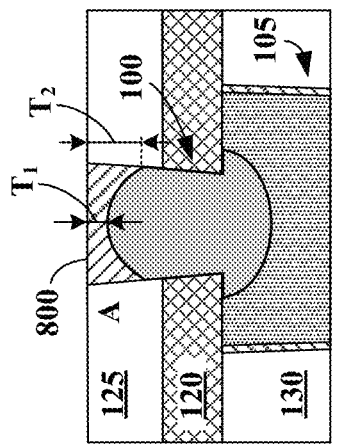

In subsequent operations 710 and 715, capping layer 800 is blanket deposited and planarized as shown in FIGS. 8H and 8I respectively. Since the top surface of ruthenium conductive structure 100 has a concave shape, $T_2$ is greater than $T_1$ (e.g., $T_2 > T_1$). In some embodiments, a ratio between $T_2/T_1$ can be greater than about 1 and less than about 2. In some embodiments, $T_2$ is substantially equal to recess height R (e.g., $T_2 = R$) shown in FIG. 8E. After planarization, the top surface of capping layer 800 is substantially planar as shown in FIG. 8I. Subsequently, upper metallization conductive structure 420 can be formed in contact with capping layer 800 according to operation 720 as shown in FIGS. 8J and 8K.

Figure 10A:
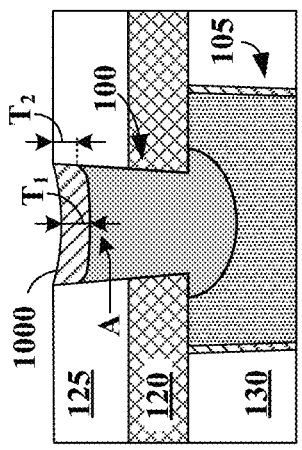
FIGS. 10A-10E are cross-sectional views of intermediate structures during various fabrication operations for forming a capping layer on a liner-free or barrier-free conductive structure, in accordance with some embodiments.

According to some embodiments, FIG. 9 is a flowchart of method 900, which is a based on method 700 shown in FIG. 7. Differences between method 900 and method 700 include the deposition method of the capping layer, which in method 900 is selectively deposited on the recessed portion of ruthenium conductive structure 100, and the absence of a removal process for the capping layer from dielectric layer 125. For example, method 900 begins with operation 905, which is similar to operation 705 of method 700. Therefore, FIGS. 10A and 10B, which correspond to intermediate ruthenium conductive structure 100 of method 900 after operation 905, are similar to FIGS. 8A and 8B of method 700 respectively.

Figure 10B:
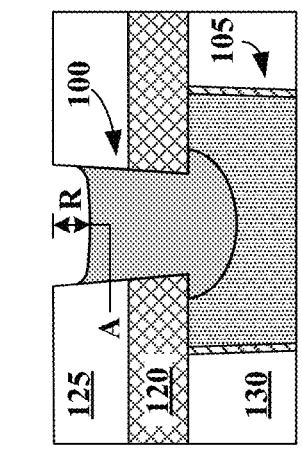
Figure 10C:
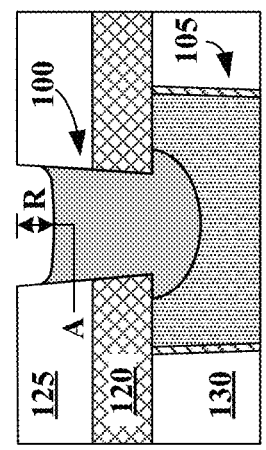

In referring to FIGS. 9 and 10C, method 900 continues with operation 910 and the process of selectively depositing a capping layer 1000 on the recessed ruthenium conductive structure. According to some embodiments, operation 910 is similar to operation 305 of method 300 shown in FIG. 3 where the capping layer is a metal, such as tungsten, deposited with a selective CVD process at a temperature range between about 300° C. and about 400° C. at a process pressure between about 1 Torr and about 10 Torr. In some embodiments, the tungsten deposition includes $WF_6$ chemistry and $H_2$ to achieve the desired deposition selectivity on ruthenium conductive structure 100. In some embodiments, the thickness of the capping layer formed on ruthenium conductive structure 100 ranges between 1.5 nm and 5 nm.

In some embodiments, the thickness of the capping layer on dielectric layer 125 is substantially zero.

Since the recessed top surface of ruthenium conductive structure 100 is not planar as discussed above, capping layer 1000 is deposited so that it follows the contours of the ruthenium conductive structure 100. By way of example and not limitation, the top surface of capping layer 1000 can also be non-planar (e.g., concave) as shown in FIG. 10C. Consequently, top surfaces of capping layer 1000 and dielectric layer 125 are not coplanar. In some embodiments, the top surface curvature of capping layer 1000 is substantially equal to or less than that of ruthenium conductive structure 100. As a result, the thickness of capping layer 1000 across the top surface of ruthenium conductive structure 100 can be substantially non-conformal. For example, $T_1$ can be equal to or greater than $T_2$ (e.g., $T_1 \geq T_2$), where $T_1$ is measured above point A located in the middle of ruthenium conductive structure 100 as discussed above.

Figure 10D:
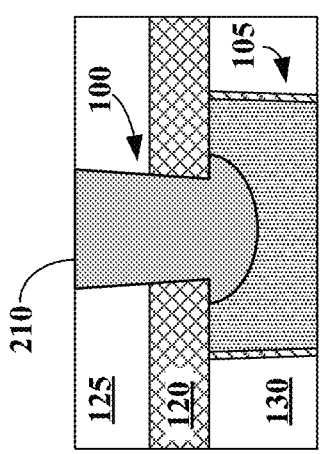

In referring to FIG. 9 method 900 continues with operation 915 and the process of forming an upper metallization conductive structure on capping layer 1000. According to some embodiments, operation 915 is similar to operation 720 of method 700 where ESL 405 and low-k dielectric 410 are first deposited on dielectric layer 125 and capping layer 1000, and subsequently patterned to form an opening 1005 that exposes capping layer 1000 as shown in FIG. 10D. Further, a barrier layer 420a and metal fill 420b are deposited in opening 1005 to form upper metallization conductive structure 420 shown in FIG. 10E. In some embodiments, due to the upper surface topography of capping layer 1000, the bottom surface of upper metallization conductive structure 420 can develop a convex feature 1010 shown in FIG. 10E. For example, the bottom surface of upper metallization conductive structure 420 in FIG. 10E may not be planar like in FIG. 8F.

In some embodiments, if recess height R is comparable between FIGS. 8B and 10B, thickness T1 shown in FIG. 8D can be greater than thickness T1 shown in FIG. 10C. In some embodiments, recess height R shown in FIGS. 8B and 10B can be adjusted so that the resulting thickness T1 of capping layers 800 and 1000 shown respectively in FIGS. 8D and 10C is comparable.

Figure 11:
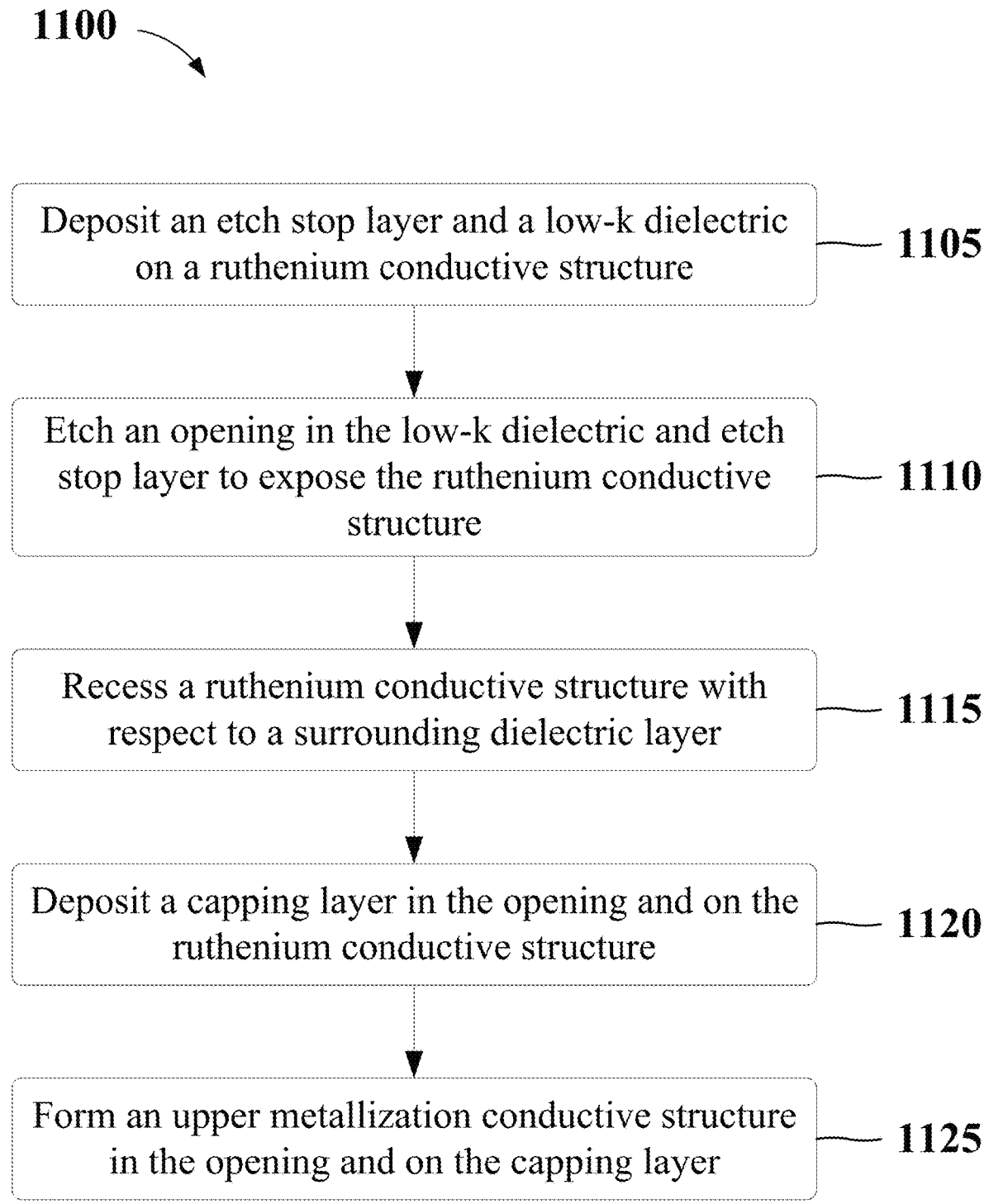
FIG. 11 is a flowchart of a method for forming a capping layer on a liner-free or barrier-free conductive structure, in accordance with some embodiments.

According to some embodiments, FIG. 11 is a flowchart of method 1100, which is a based on method 500 shown in FIG. 5. A difference between method 1100 and method 500 is the addition of a recessing operation for the ruthenium conductive structure as discussed below. In some embodiments, method 1100 begins with operations 1105 and 1110, which are similar to respective operations 505 and 510 of method 500. Therefore, FIGS. 12A, 12B, and 12C, which correspond to operations 1105 and 1110, are similar to FIGS. 6A, 6B, and 6C, which correspond to operations 505 and 510. In some embodiments, opening 1200 shown in FIG. 12C is similar to opening 600 shown in FIG. 6C.

In referring to FIG. 11 method 1100 continues with operation 1115 and the process of recessing ruthenium conductive structure 100 with respect to surrounding dielectric layer 125. In some embodiments, aspects of operation 1115 is similar to operation 705 of method 700. For example, ruthenium conductive structure 100 can be recessed with a selective etch-back process that includes a wet etching chemistry such as hypochlorous acid (HClO), which does not substantially etch dielectric layer 125. In some embodiments, recess height R is controlled via the etch-back process conditions, such as the etching time, and is equal to or less than about 5 nm to prevent excess removal of low resistance ruthenium metal, high contact resistance, and performance degradation as discussed above. In some embodiments, and due to its isotropic nature, the etch-back process forms a concave top surface for ruthenium conductive structure 100 as shown in FIG. 12D. In some embodiments, recess height R is taller above turning point A and shorter above vertical sidewall surfaces of ruthenium conductive structure 100.

In referring to FIG. 11 method 1100 continues with operations 1120 and 1125, which are similar to operations 515 and 520 of method 500 described above. For example, FIG. 12E shows that the deposited capping layer 1210 follows the top surface topography of ruthenium conductive structure 100 and covers sidewall and bottom surfaces of opening 1200. In some embodiments, capping layer 1210 does not fill opening 1200 and extends over top surfaces of low-k dielectric 410. By way of example, capping layer 1210 can be deposited with an ALD process, a CVD process, or another suitable process capable of depositing conformal capping layers. In some embodiments, capping layer 1210 includes a W layer, a titanium nitride (TiN) layer, or a TaN layer. In some embodiments, the thickness of capping layer 1210 is substantially constant over the top surface of ruthenium conductive structure 100.

As discussed above, W can be deposited with a CVD process using a mixture of $WF_6$ and $H_2$ at a process pressure higher than about 10 Torr, and with an ALD process using $WF_6$ and $H_2B_6$. Both the CVD and ALD deposited W layers can be formed at a temperature range between about 300° C. and about 400° C. Further, TiN layers can be deposited with a CVD or an ALD process using $TiCl_4$ and $NH_3$ plasma at a temperature range between about 300° C. and about 400° C. TaN layers can be deposited with a CVD or an ALD process using $TaCl_4$ and $NH_3$ plasma at a temperature range between about 300° C. and about 400° C. In some embodiments, the thickness of capping layer 1210 ranges between about 1.5 nm and about 5 nm to mitigate the impact on contact resistance and provide adequate protection against cobalt diffusion as discussed above.

Subsequently, upper metallization conductive structure 420 can be formed over capping layer 1210 as shown in FIG. 12F and described in operations 520 and 320 above. In some embodiments, if capping layer 1210 is selected to be a TaN layer as described above, the formation of barrier layer 420a can be optional depending on the deposited thickness of the TaN capping layer. For example, if capping layer 1210 is sufficiently thick (e.g., thicker than about 1.5 nm) to block both cobalt and copper atoms, barrier layer 420a can be omitted. On the other hand, if capping layer 1210 is not sufficiently thick (e.g., thinner than about 1.5 nm) to block cobalt and copper atoms, an additional TaN barrier layer 420a can be deposited via PVD on the CVD or ALD deposited TaN capping layer (e.g., capping layer 1210).

Figure 10E:
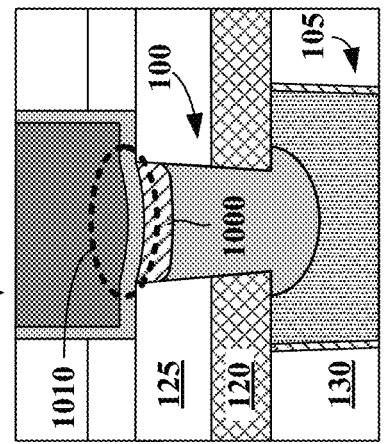

In some embodiments, and in referring to FIG. 12F, due to the upper surface topography of capping layer 1210, the bottom surface of upper metallization conductive structure 420 may develop a convex feature 1220 similar to convex feature 1010 shown in FIG. 10E.

As discussed above, the material selection, as well as the deposition method, for the capping layer is based on desired properties such as selectivity, uniformity, or gap fill. For example, if a selective deposition is desired irrespective of the underlying topography (e.g., as in methods 300 and 900), a W capping layer can be deposited with a CVD process with $WF_6$ and $H_2$ at a temperature range between about 300° C. and about 400° C., and a process pressure between about 1 Torr and 10 Torr. If a uniform or conformal deposition is desired irrespective of the underlying topography (e.g., as in methods 500 and 1100), a W capping layer, a TiN capping layer, or a TaN capping layer can be deposited with a CVD or an ALD process. Further, if a blanket deposition is desired (e.g., as in method 700), a W capping layer, a TiN capping layer, or a TaN capping layer can be deposited with a CVD or a PVD process.

In some embodiments, the selective etch-back process used in operation 1115 to recess ruthenium conductive structure 100 with respect to surrounding dielectric layer 125 leaves ruthenium conductive structure 100 with a concave top surface as shown in FIG. 12G. In some embodiments, FIG. 12G is similar to FIG. 8E discussed above with the exception of ESL and low-k dielectric 405 and 410. Similar to FIG. 8E, in FIG. 12G, recess height R is measured between a sidewall top surface of ruthenium conductive structure 100 and a top surface of dielectric layer 125 as shown in FIG. 12G. In some embodiments, recess height R is equal to or less than about 5 nm to prevent excess removal of low resistance ruthenium metal, high contact resistance, and performance degradation. In some embodiments, the selective etch-back process includes an etching process that does not substantially etch low-k dielectric 410, ESL 405, or dielectric layer 125. For example, the etching process can include an ion bombardment process or a plasma etch process. In some embodiments, a voltage bias can be supplied to the substrate during the etching process. For example, the applied voltage bias can be between about 100 V and about 1100 V, between about 150 V and about 1050 V, between about 200 V and about 1000 V, or any suitable voltage biases. In some embodiments, increasing the voltage bias can result in excess removal of the low resistance ruthenium metal.

In subsequent operations 1120 and 1125, capping layer 1210 is blanket deposited as shown in FIG. 12H. Similar to FIG. 12E, capping layer 1210 in FIG. 12H follows the top surface topography of conductive structure 100 and covers sidewall and bottom surfaces of opening 1200. In some embodiments, capping layer 1210 does not fill opening 1200 and extends over top surfaces of low-k dielectric 410.

Subsequently, upper metallization conductive structure 420 can be formed over capping layer 1210 as shown in FIG. 12I. In some embodiments, if capping layer 1210 is selected to be a TaN layer as described above, the formation of barrier layer 420a can be optional depending on the deposited thickness of the TaN capping layer. For example, if capping layer 1210 is sufficiently thick (e.g., thicker than about 1.5 nm) to block both cobalt and copper atoms, barrier layer 420a can be omitted. On the other hand, if capping layer 1210 is not sufficiently thick (e.g., thinner than about 1.5 nm) to block cobalt and copper atoms, an additional TaN barrier layer 420a can be deposited via PVD on the CVD or ALD deposited TaN capping layer (e.g., capping layer 1210).

In some embodiments, and in referring to FIG. 12I, due to the upper surface topography of capping layer 1210, the bottom surface of upper metallization conductive structure 420 may develop a convex feature 1225 with a concave bottom surface topography that follows the upper surface topography of the underlying ruthenium conductive structure 100. In some embodiments, the bottom surface of feature 1225 is substantially planar and does not follow the upper surface topography of the underlying ruthenium conductive structure 100.

In some embodiments, FIG. 13 is a flowchart of method 1300, which is a variation of method 1100 shown in FIG. 11. According to some embodiments, method 1300 has similar corresponding operations with method 1100. One exception between method 1300 and 1100 is operation 1315, which is different from operation 1115. More specifically, in operation 1315, dielectric layer 125 is partially etched as opposed to ruthenium conductive structure 100 being recessed. In some embodiments, FIG. 14A shows FIG. 12C after operation 1315 during which dielectric layer 125 is partially etched by an amount H to expose a portion of sidewall surfaces of ruthenium conductive structures 100. In some embodiments, a ratio of etched height H over the thickness of dielectric layer 125 can be between about 5% and about 35%, between about 10% and about 30%, between about 15% and about 25%, or any suitable ratios. In some embodiments, the etching process of operation 1315 does not substantially etch ESL 405 and low-k dielectric 410. In some embodiments, the etching process of operation 1315 results in top corner rounding for ruthenium conductive structures 100 as shown by dashed circle 1330 in FIG. 14A. In some embodiments, precursors of the etching process of operation 1315 can include boron trichloride, chlorine, hydrogen bromide, any suitable precursors, or combinations thereof.

In operation 1320, capping layer 1210 is blanket deposited in opening 1200 as shown in FIG. 14B. Similar to FIG. 12E, capping layer 1210 in FIG. 14B follows the top surface topography of conductive structure 100 and covers sidewall and bottom surfaces of opening 1200. In some embodiments, capping layer 1210 does not fill opening 1200 and extends over top surfaces of low-k dielectric 410. Further, capping layer 1200 fills the spacing between the sidewall surfaces of conductive structures 100 and dielectric layer 125 as shown by dashed circle 1335.

Subsequently, upper metallization conductive structure 420 can be formed over capping layer 1210 according to operation 1325 as shown in FIG. 14C. In some embodiments, if capping layer 1210 is selected to be a TaN layer as described above, the formation of barrier layer 420a can be optional depending on the deposited thickness of the TaN capping layer. For example, if capping layer 1210 is sufficiently thick (e.g., thicker than about 1.5 nm) to block both cobalt and copper atoms, barrier layer 420a can be omitted. On the other hand, if capping layer 1210 is not sufficiently thick (e.g., thinner than about 1.5 nm) to block cobalt and copper atoms, an additional TaN barrier layer 420a can be deposited via PVD on the CVD or ALD deposited TaN capping layer (e.g., capping layer 1210).

In some embodiments, and in referring to FIG. 14C, due to the upper surface topography of capping layer 1210, the bottom surface of upper metallization conductive structure 420 may develop a concave feature 1340 that follows the upper surface topography of the underlying ruthenium conductive structure 100.

Various embodiments described herein are directed to ruthenium capping layers configured to prevent the migration of out-diffused cobalt atoms into the upper metallization layers (e.g., to copper wiring). In some embodiments, the capping layers are formed between a top surface of the ruthenium metal fill and the conductive structures of the upper metallization layers. In some embodiments, the capping layers described herein also function as copper electromigration barrier layers for the upper metallization layers. In some embodiments, the capping layer includes a pure metal (e.g., W) or a metal nitride (e.g., TiN and TaN). In some embodiments, the capping layer has a low electrical resistivity (e.g., less than about 150 $\mu\Omega\cdot$cm), low solubility in ruthenium and cobalt, a melting point greater than about 600° C., and a formation temperature less than about 400° C. In some embodiments, the capping layer is selectively deposited on the top surface of the ruthenium conductive structure. In some embodiments, the capping layer is blanket deposited on the ruthenium conductive structure. In some embodiments, the ruthenium conductive structure is recessed prior to the formation of the capping layer.

In some embodiments, structure includes a substrate and a first metallization layer on the substrate where the first metallization layer comprises a liner-free conductive structure surrounded by a dielectric. The structure also includes a capping layer on a top surface of the liner-free conductive structure and a second metallization layer on the first metallization layer that includes a conductive structure on the liner-free conductive structure. Further, the capping layer is interposed between the top surface of the liner-free conductive structure and a bottom surface of the conductive structure.

In some embodiments, a structure includes a substrate with a first metallization layer formed thereon, where the first metallization layer has a liner-free conductive structure surrounded by a dielectric. The structure also includes a capping layer on a top surface of the liner-free conductive structure and not in contact with the dielectric. Further, the structure includes a second metallization layer on the first metallization layer where the second metallization layer includes a conductive structure on the liner-free conductive structure. Further, the liner-free conductive structure is separated from the conductive structure by the capping layer.

In some embodiments, a method includes depositing a cobalt diffusion barrier layer on a liner-free conductive structure that includes ruthenium, where depositing the cobalt diffusion barrier layer includes forming the cobalt diffusion barrier layer self-aligned to the liner-free conductive structure. The method also includes depositing, on the cobalt diffusion barrier layer, a stack with an etch stop layer and dielectric layer, and forming an opening in the stack to expose the cobalt diffusion barrier layer. Finally, the method includes forming a conductive structure on the cobalt diffusion barrier layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
forming, in a first dielectric layer, a liner-free conductive structure comprising a first metal;
etching the liner-free conductive structure to form an opening in the first dielectric layer;
depositing, on the liner-free conductive structure, a cobalt diffusion barrier layer comprising a second metal different from the first metal;
depositing, on the first dielectric layer, a second dielectric layer; and
forming, on the cobalt diffusion barrier layer, a conductive structure comprising a third metal different from the first and second metals.

2. The method of claim 1, wherein forming the liner-free conductive structure comprises depositing ruthenium in an opening in the first dielectric layer.

3. The method of claim 1, wherein etching the liner-free conductive structure comprises forming the opening with a concave-shaped or a convex-shaped cross-sectional profile.

4. The method of claim 1, wherein depositing the cobalt diffusion barrier layer comprises depositing a tungsten-, titanium-, or tantalum-based layer on the liner-free conductive structure to fill the opening in the first dielectric layer.

5. The method of claim 1, wherein depositing the cobalt diffusion barrier layer comprises depositing a tungsten-, titanium-, or tantalum-based layer conformally along sidewalls of the first dielectric layer and top surfaces of the liner-free conductive structure and the first dielectric layer.

6. The method of claim 1, wherein depositing the second dielectric layer is performed after depositing the cobalt diffusion barrier layer.

7. The method of claim 1, wherein depositing the second dielectric layer is performed prior to etching the liner-free conductive structure.

8. The method of claim 1, wherein depositing the cobalt diffusion barrier layer comprises depositing a tungsten-, titanium-, or tantalum-based layer conformally along sidewalls of an opening in the second dielectric layer and on and a top surface of the liner-free conductive structure.

9. The method of claim 1, wherein forming the conductive structure comprises depositing a metal layer directly on the cobalt diffusion barrier layer.

10. The method of claim 1, wherein forming the conductive structure comprises depositing a metal layer directly on the first dielectric layer and the cobalt diffusion barrier layer.

11. The method of claim 1, further comprising etching the second dielectric layer to form an opening in the second dielectric layer,
wherein forming the conductive structure comprises depositing a metal layer to fill the opening in the second dielectric layer.

12. The method of claim 1, wherein forming the cobalt diffusion barrier layer comprises depositing a tungsten-, titanium-, or tantalum-based layer at a deposition temperature between about 300° C. and about 400° C.

13. A method, comprising:
forming, in a first dielectric layer, a liner-free conductive structure comprising a first metal;
depositing, on the liner-free conductive structure, a dome-shaped barrier structure comprising a second metal different from the first metal;
depositing a second dielectric layer on the first dielectric layer and the dome-shaped barrier structure; and
forming a conductive structure in the second dielectric layer.

14. The method of claim 13, wherein forming the liner-free conductive structure comprises depositing ruthenium in an opening in the first dielectric layer.

15. The method of claim 13, wherein depositing the dome-shaped barrier structure comprises depositing a dome-shaped tungsten layer with a base wider than a width of the liner-free conductive structure.

16. The method of claim 13, wherein forming the conductive structure comprises:
etching the second dielectric layer to expose a top surface of the dome-shaped barrier structure; and depositing a metal layer on the top surface of the dome-shaped barrier structure.

17. A structure, comprising:
a substrate;
a first metallization layer, disposed on the substrate, comprising:
   a liner-free conductive structure comprising a first metal,
   a barrier layer, disposed on the liner-free conductive structure, comprising a second metal different from the first metal, and
   a first dielectric layer surrounding the liner-free conductive structure and the barrier layer; and
a second metallization layer, disposed on the first metallization layer, comprising:
   a conductive structure disposed on the barrier layer and the first dielectric layer; and
   a second dielectric layer surrounding the conductive structure.

18. The structure of claim 17, wherein a top surface of the barrier layer is substantially coplanar with a top surface of the first dielectric layer.

19. The structure of claim 17, wherein the barrier layer comprises:
   a first portion disposed on a top surface of the liner-free conductive structure;
   a second portion disposed along sidewalls of the first dielectric layer; and
   a third portion disposed along sidewalls of the second dielectric layer.

20. The structure of claim 17, wherein a portion of the conductive structure is disposed in the first dielectric layer.

* * * * *